United States Patent
Kang

(10) Patent No.: US 11,935,988 B2
(45) Date of Patent: Mar. 19, 2024

(54) DISPLAY DEVICE

(71) Applicant: SAMSUNG DISPLAY CO., LTD., Yongin-si (KR)

(72) Inventor: Sin Chul Kang, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 313 days.

(21) Appl. No.: 17/296,814

(22) PCT Filed: May 24, 2019

(86) PCT No.: PCT/KR2019/006271
§ 371 (c)(1),
(2) Date: May 25, 2021

(87) PCT Pub. No.: WO2020/111413
PCT Pub. Date: Jun. 4, 2020

(65) Prior Publication Data
US 2022/0005979 A1 Jan. 6, 2022

(30) Foreign Application Priority Data
Nov. 26, 2018 (KR) .................. 10-2018-0147650

(51) Int. Cl.
*H01L 25/075* (2006.01)
*H01L 33/38* (2010.01)
*H01L 33/62* (2010.01)

(52) U.S. Cl.
CPC ........ *H01L 33/387* (2013.01); *H01L 25/0753* (2013.01); *H01L 33/62* (2013.01)

(58) Field of Classification Search
CPC ............... H01L 25/0753; H01L 33/62
See application file for complete search history.

(56) References Cited

U.S. PATENT DOCUMENTS 9,773,761 B2  9/2017 Do
10,249,603 B2  4/2019 Cho et al.
(Continued)

FOREIGN PATENT DOCUMENTS

EP    3 343 633    7/2018
KR    10-1490758   2/2015
(Continued)

OTHER PUBLICATIONS

International Search Report, with English translation, corresponding to International Application No. PCT/KR2019/006271 dated Aug. 30, 2019.
(Continued)

*Primary Examiner* — Daniel P Shook
(74) *Attorney, Agent, or Firm* — KILE PARK REED & HOUTTEMAN PLLC

(57) ABSTRACT

A display device includes a plurality of pixels, each of the plurality of pixels including an emission area, a first electrode and a second electrode that are disposed in the emission area to be spaced apart from each other, and a plurality of light emitting elements that are electrically connected between the first and second electrodes, and a bank disposed between the emission area of each of the plurality of pixels to enclose the emission area. The first electrode includes a first electrode part disposed in the emission area to be adjacent to a first side of the second electrode, a second electrode part disposed in the emission area to be adjacent to a second side of the second electrode, and a third electrode part electrically connecting the first and second electrode parts and disposed in the emission area to be adjacent to a third side of the second electrode.

20 Claims, 23 Drawing Sheets

(56) References Cited

U.S. PATENT DOCUMENTS

| | | | |
|---|---|---|---|
| 10,276,630 B2 | 4/2019 | Lee et al. | |
| 10,461,123 B2 * | 10/2019 | Kim | H01L 33/385 |
| 10,672,946 B2 | 6/2020 | Cho et al. | |
| 10,818,647 B2 | 10/2020 | Kim et al. | |
| 2012/0153319 A1 | 6/2012 | Hsu | |
| 2017/0358563 A1 | 12/2017 | Cho et al. | |
| 2018/0138157 A1 | 5/2018 | Im et al. | |
| 2018/0175104 A1 | 6/2018 | Kang et al. | |
| 2018/0175106 A1 | 6/2018 | Kim et al. | |
| 2018/0198018 A1 | 7/2018 | Kim et al. | |
| 2018/0287010 A1 | 10/2018 | Sung | |

FOREIGN PATENT DOCUMENTS

| | | |
|---|---|---|
| KR | 10-2016-0059569 | 5/2016 |
| KR | 10-2016-0059574 | 5/2016 |
| KR | 10-2018-0007025 | 1/2018 |
| KR | 10-2018-0007376 | 1/2018 |
| KR | 10-2018-0011404 | 2/2018 |
| KR | 10-2018-0072909 | 7/2018 |
| KR | 10-1987196 | 6/2019 |

OTHER PUBLICATIONS

Written Opinion, with English translation, corresponding to International Application No. PCT/KR2019/006271, dated Aug. 30, 2019.

* cited by examiner

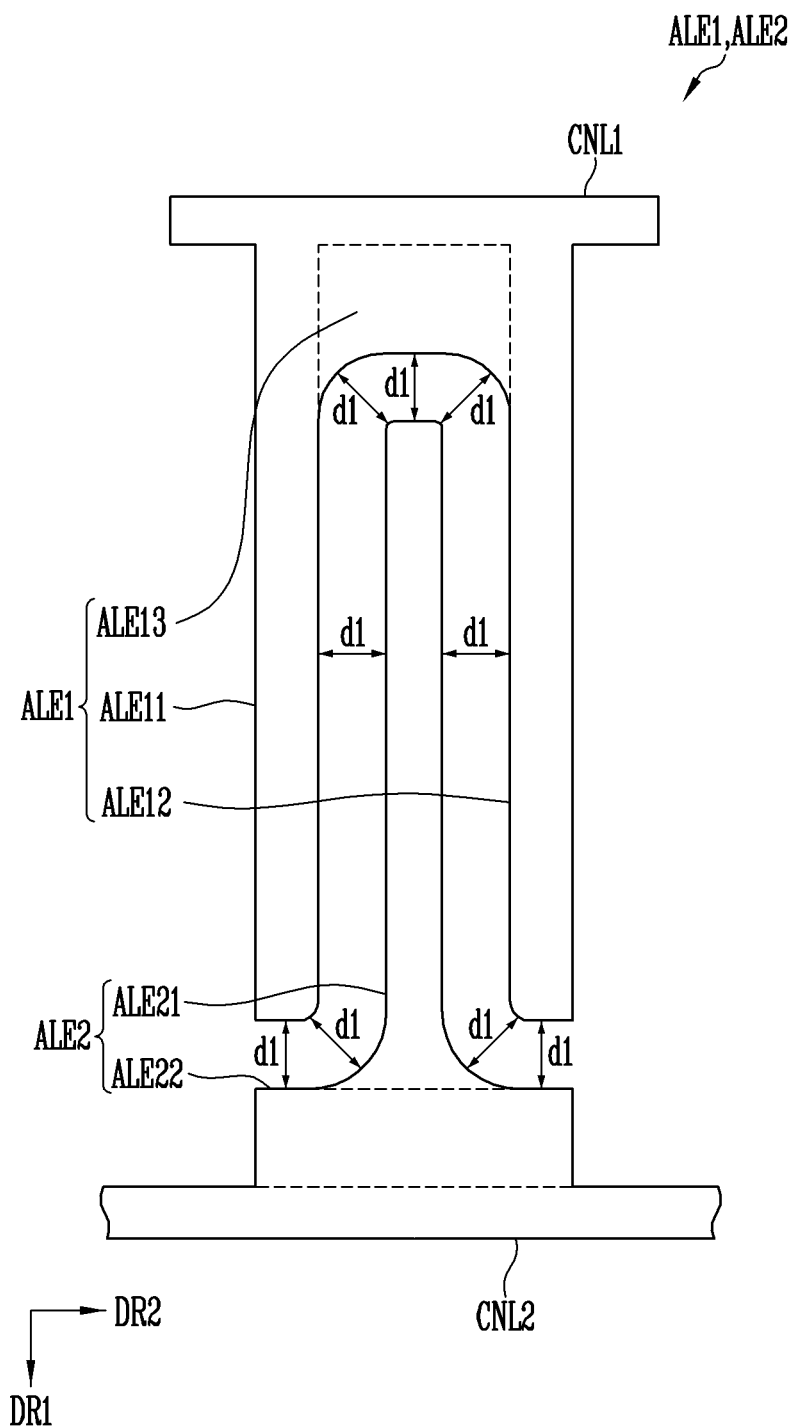

DISPLAY DEVICE

CROSS-REFERENCE TO RELATED APPLICATION(S)

This application is a national entry of International Application No. PCT/KR2019/006271, filed on May 24, 2019, which claims under 35 U.S.C. §§ 119(a) and 365(b) priority to and benefits of Korean Patent Application No. 10-2018-0147650, filed on Nov. 26, 2018 in the Korean Intellectual Property Office (KIPO), the entire contents of which are incorporated herein by reference.

BACKGROUND

1. Technical Field

Various embodiments of the disclosure relate to a display device.

2. Description of the Related Art

Recently, the technique of manufacturing a subminiature light emitting element using a material of a reliable inorganic crystal structure and manufacturing a light emitting device using the light emitting element has been developed. For example, the technique of manufacturing subminiature light emitting elements having a small size in a range of a nanometer scale to a micrometer scale, and manufacturing various light emitting devices such as a pixel of a display device using the subminiature light emitting elements has been developed.

SUMMARY

Various embodiments of the disclosure are directed to a display device with a pixel including light emitting elements.

According to an aspect of the disclosure, a display device may include a plurality of pixels, each of the plurality of pixels including an emission area, a first electrode and a second electrode that are disposed in the emission area to be spaced apart from each other, and a plurality of light emitting elements that are electrically connected between the first and second electrodes, and a bank disposed between the emission area of the plurality of pixels to enclose the emission area. The first electrode may include a first electrode part disposed in the emission area to be adjacent to a first side of the second electrode, a second electrode part disposed in the emission area to be adjacent to a second side of the second electrode, and a third electrode part electrically connecting the first and second electrode parts and disposed in the emission area to be adjacent to a third side of the second electrode.

Each of the first, second, and third electrode parts may be spaced apart from the second electrode by a distance that is equal to or less than a length of each of the plurality of light emitting elements.

At least two of the first, second, and third electrode parts may be spaced apart from the second electrode by a same distance.

The first and second electrode parts may extend in a first direction in the emission area to be parallel to each other, and the third electrode part may extend in a second direction intersecting the first direction in the emission area.

The first, second, and third electrode parts may be integral with each other.

The first electrode may be bent so that a part of the first electrode facing the second electrode at a boundary between the first, second, and third electrode parts is curved, and a part of the second electrode facing the part of the first electrode may be curved and correspond to a shape of the first electrode.

The first and second electrode parts may be symmetrical with each other, and the second electrode may be disposed between the first and second electrode parts.

The second electrode may include a main electrode part disposed between the first and second electrode parts, and enclosed by the first electrode, and a sub-electrode part electrically connected to a first end of the main electrode part and extending in a direction different from a direction in which the main electrode part extends, to face a first end of each of the first and second electrode parts.

The first and second electrode parts and the main electrode part may extend in a first direction in the emission area to be parallel to each other, and the third electrode part and the sub-electrode part may extend in a second direction intersecting the first direction in the emission area to be parallel to each other.

The second electrode may include a main electrode part that is circular or elliptical, and the first, second, and third electrode parts may enclose the main electrode part and have a shape corresponding to a shape of the main electrode part.

The second electrode may include a sub-electrode part that is electrically connected to the main electrode part and is disposed in the emission area to face a first end of each of the first and second electrode parts.

Each of the plurality of light emitting elements may include a first end overlapping the first electrode and electrically connected to the first electrode, and a second end overlapping the second electrode and electrically connected to the second electrode.

Each of the plurality of pixels may include a third electrode overlapping the first electrode, having a shape corresponding to a shape of the first electrode, and electrically connected to the first end of each of the plurality of light emitting elements through the first electrode, and a fourth electrode overlapping the second electrode, having a shape corresponding to a shape of the second electrode, and electrically connected to the second end of each of the plurality of light emitting elements through the second electrode.

The third electrode may be electrically connected to a first line to which first power or a first driving signal is supplied, and the fourth electrode may be electrically connected to a second line to which second power or a second driving signal is supplied.

Each of the plurality of pixels may include a first wall disposed under the third electrode, having a width that is narrower than a width of the third electrode, and having a shape corresponding to the shape of the third electrode, and a second wall disposed under the fourth electrode, having a width that is narrower than a width of the fourth electrode, and having a shape corresponding to the shape of the fourth electrode.

According to an aspect of the disclosure, a display device may include a plurality of pixels, each of the plurality of pixels may include an emission area, a first electrode and a second electrode that are disposed in the emission area to be spaced apart from each other, and a plurality of light emitting elements that are electrically connected between the first and second electrodes, and a bank disposed between the emission area of each of the plurality of pixels to enclose the emission area. The second electrode may include a main electrode part disposed in the emission area to be enclosed by the first electrode, and a sub-electrode part electrically connected to a first end of the main electrode part and extending in a direction different from a direction in which the main electrode part extends, in the emission area to face ends of the first electrode.

The first electrode may include a first electrode part disposed in the emission area to be adjacent to a first side of the main electrode part, a second electrode part disposed in the emission area to be adjacent to a second side of the main electrode part, and a third electrode part electrically connecting the first and second electrode parts, and disposed in the emission area to be adjacent to a third side of the main electrode part.

Each of the first, second, and third electrode parts may be spaced apart from the second electrode by a distance that is equal to or less than a length of each of the plurality of light emitting elements.

At least two of the first, second, and third electrode parts may be spaced apart from the second electrode by a same distance.

Each of the plurality of pixels may include a third electrode overlapping the first electrode, having a shape corresponding to a shape of the first electrode, and electrically connected to a first end of each of the plurality of light emitting elements through the first electrode, and a fourth electrode overlapping the second electrode, having a shape corresponding to a shape of the second electrode, and electrically connected to a second end of each of the plurality of light emitting elements through the second electrode.

A display device including a pixel in accordance with various embodiments of the disclosure can form a light source unit by more efficiently utilizing light emitting elements supplied to an emission area of each pixel.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 14A is a plan view schematically illustrating first and second alignment electrodes of FIG. 13.

DETAILED DESCRIPTION OF THE EMBODIMENTS

Figure 1A:
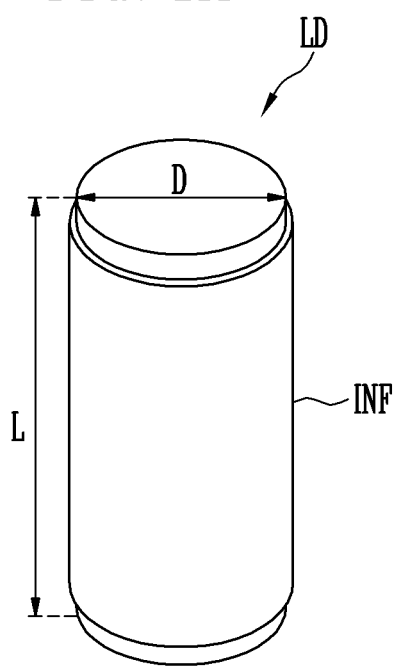
FIGS. 1A and 1B are a perspective view and a cross-sectional view schematically illustrating a light emitting element in accordance with an embodiment of the disclosure.

Reference will now be made in detail to various embodiments of the disclosure, specific examples of which are illustrated in the accompanying drawings and described below, since the embodiments of the disclosure can be variously modified in many different forms. However, the disclosure is not limited to the following embodiments and may be modified into various forms.

Some elements which are not directly related to the features of the disclosure in the drawings may be omitted to clearly explain the disclosure. Furthermore, the sizes, ratios, etc. of some elements in the drawings may be exaggerated. It should be noted that the same reference numerals are used to designate the same or similar elements throughout the drawings, and repetitive explanation will be omitted.

It will be understood that, although the terms "first," "second," etc. may be used herein to describe various elements, these elements should not be limited by these terms. It will be further understood that the terms "comprise," "include," "have," etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first component or part is disposed on a second component or part, the first component or part may be not only directly on the second component or part but a third component or part may intervene between them. Furthermore, the term "position," "direction," etc. used in the following description are defined in relative terms, and it should be noted that they may be changed into a reverse position or direction depending on a view angle or direction.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Embodiments and required details of the disclosure are described with reference to the accompanying drawings in order to describe the disclosure in detail so that those having ordinary knowledge in the technical field to which the disclosure pertains can easily practice the disclosure. Furthermore, a singular form may include a plural form as long as it is not specifically mentioned in a sentence.

FIGS. 1A, 1B, 2A, 2B, 3A, and 3B are schematic perspective views and schematic cross-sectional views illustrating a light emitting element (or light emitting diode) LD in accordance with an embodiment. Although a rod-type light emitting element LD of a cylindrical shape is illustrated in FIGS. 1A to 3B, the type and/or shape of the light emitting element LD according to the disclosure are not limited thereto.

Figure 1B:
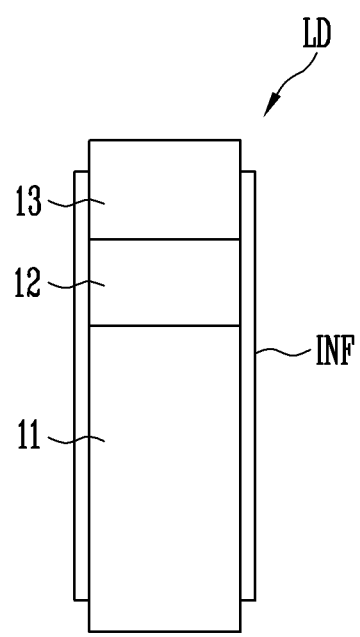

First, referring to FIGS. 1A and 1B, the light emitting element LD in accordance with the embodiment may include a first semiconductor layer 11, a second semiconductor layer 13, and an active layer 12 interposed between the first and second semiconductor layers 11 and 13. For example, the light emitting element LD may be configured as (or formed as) a stack formed by successively stacking the first semiconductor layer 11, the active layer 12, and the second semiconductor layer 13 in a longitudinal direction.

In an embodiment, the light emitting element LD may be provided in the form of a rod extending in a direction. If the direction in which the light emitting element LD extends is defined as the longitudinal direction, the light emitting element LD may have a first end and a second end in the longitudinal direction.

In an embodiment, one of the first and second semiconductor layers 11 and 13 may be disposed on the first end of the light emitting element LD, and the other of the first and second semiconductor layers 11 and 13 may be disposed on the second end of the light emitting element LD.

In an embodiment, the light emitting element LD may be a rod-type light emitting diode manufactured in the form of a rod. In this specification, the term "rod-type shape" may mean a rod-like shape or a bar-like shape such as a cylindrical shape or a prismatic shape extending in the longitudinal direction (i.e., to have an aspect ratio greater than 1), and the cross-sectional shape thereof is not limited to a particular shape. For example, a length L of the light emitting element LD may be greater than a diameter D thereof (or a width of the cross-section thereof).

In an embodiment, the light emitting element LD may have a small size in a range of a nanometer scale to a micrometer scale. For instance, the light emitting element LD may have a diameter D and/or a length L in a range of the nanometer scale to the micrometer scale. However, in the disclosure, the size of the light emitting element LD is not limited thereto. For example, the size of the light emitting element LD may be changed in various ways depending on design conditions of various devices, e.g., a display device, which includes, as a light source, a light emitting device using the light emitting element LD.

The first semiconductor layer 11 may include, for example, at least one n-type semiconductor layer. For instance, the first semiconductor layer 11 may include an n-type semiconductor layer which includes one semiconductor material of InAlGaN, GaN, AlGaN, InGaN, AlN, and InN and is doped with a first conductive dopant such as Si, Ge, or Sn. However, the material forming the first semiconductor layer 11 is not limited thereto, and the first semiconductor layer 11 may be formed of various other materials.

The active layer 12 may be disposed on the first semiconductor layer 11 and have a single or multiple quantum well structure. In an embodiment, a cladding layer (not shown) doped with a conductive dopant may be formed above and/or under the active layer 12. For example, the cladding layer may be formed of (or include) an AlGaN layer or an InAlGaN layer. In an embodiment, a material such as AlGaN or AlInGaN may be used to form the active layer 12, and various other materials may be used to form the active layer 12.

If a voltage equal to or greater than a threshold voltage is applied to the opposite ends of the light emitting element LD, the light emitting element LD may emit light by combination of electron-hole pairs in the active layer 12. Since light emission of the light emitting element LD may be controlled based on the foregoing principle, the light emitting element LD may be used as a light source of various light emitting devices as well as a pixel of the display device.

The second semiconductor layer 13 may be disposed on the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which includes one semiconductor material of InAlGaN, GaN, AlGaN, InGaN, AlN, and InN and is doped with a second conductive dopant such as Mg. However, the material forming the second semiconductor layer 13 is not limited thereto, and the second semiconductor layer 13 may be formed of (or include) various other materials.

In an embodiment, the light emitting element LD may further include an insulating film INF provided on the surface of the light emitting element LD. The insulating film INF may be formed on the surface of the light emitting element LD to enclose at least an outer circumferential surface of the active layer 12. The insulating film INF may further enclose an area of each of the first and second semiconductor layers 11 and 13. The insulating film INF may expose the opposite ends of the light emitting element LD that have different polarities to the outside. For example, the insulating film INF may expose an end of each of the first and second semiconductor layers 11 and 13 that are disposed on the respective opposite ends of the light emitting element LD in the longitudinal direction, and, for example, may expose two surfaces of the cylinder (the top and bottom surfaces of the light emitting element LD in FIGS. 1A and 1B) rather than covering it.

In an embodiment, the insulating film INF may include at least one insulating material of $SiO_2$, $Si_3N_4$, $Al_2O_3$, and $TiO_2$, but it is not limited thereto. In other words, the material forming the insulating film INF is not limited to a particular material, and the insulating film INF may be formed of known various insulating materials.

In an embodiment, the light emitting element LD may further include additional components as well as the first semiconductor layer 11, the active layer 12, the second semiconductor layer 13, and/or the insulating film INF. For example, the light emitting element LD may further include at least one fluorescent layer, at least one active layer, at least one semiconductor layer and/or at least one electrode layer disposed on an end of the first semiconductor layer 11, the active layer 12, and/or the second semiconductor layer 13.

Figure 2A:
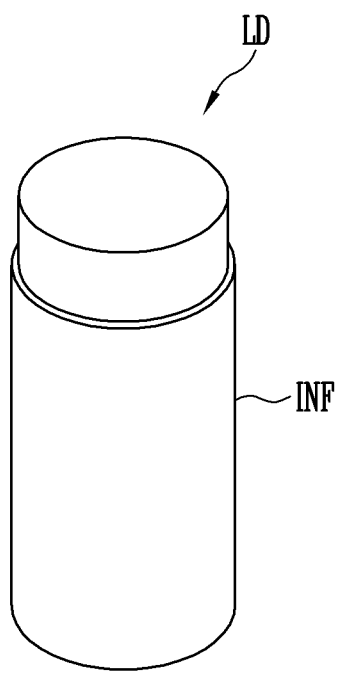
FIGS. 2A and 2B are a perspective view and a cross-sectional view schematically illustrating a light emitting element in accordance with an embodiment of the disclosure.
Figure 2B:
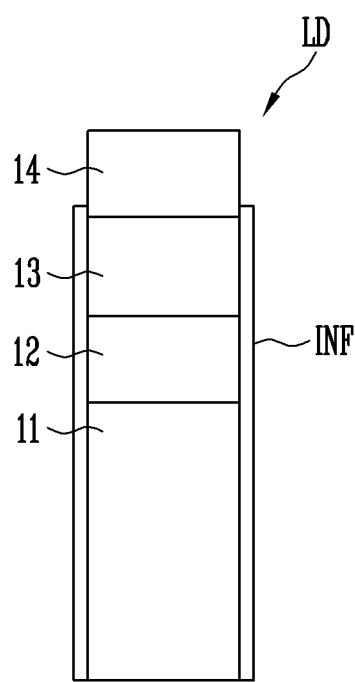
Figure 3A:
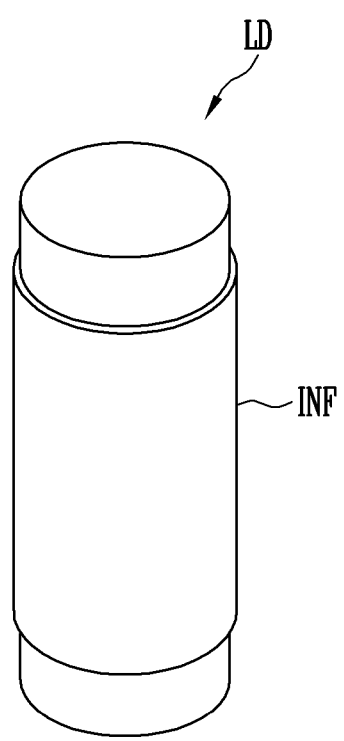
FIGS. 3A and 3B are a perspective view and a cross-sectional view schematically illustrating a light emitting element in accordance with an embodiment of the disclosure.
Figure 3B:
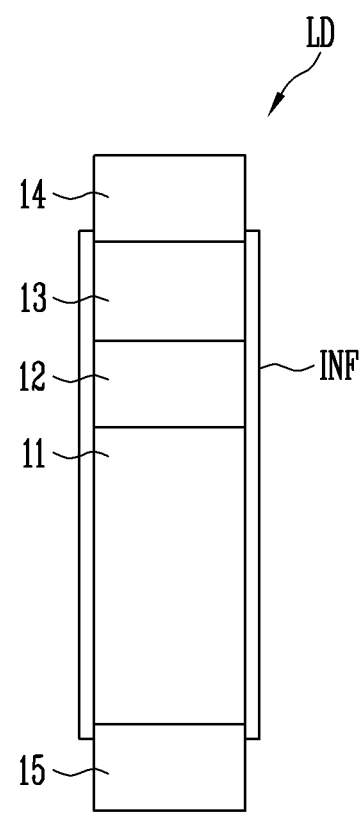

For example, as shown in FIGS. 2A and 2B, the light emitting element LD may further include at least one electrode layer 14 disposed on the first end of the second semiconductor layer 13. In an embodiment, as shown in FIGS. 3A and 3B, the light emitting element LD may further include at least one electrode layer 15 disposed on the first end of the first semiconductor layer 11.

Each of the electrode layers 14 and 15 may be an ohmic contact electrode, but it is not limited thereto. Furthermore, each of the electrode layers 14 and 15 may include metal or a metal oxide. For example, Cr, Ti, Al, Au, Ni, ITO, IZO, ITZO, and an oxide or alloy thereof may be used alone or in combination. In an embodiment, the electrode layers 14 and 15 may be substantially transparent or translucent. Therefore, light generated from the light emitting element LD may be emitted to the outside of the light emitting element LD through the electrode layers 14 and 15.

In an embodiment, the insulating film INF may at least partially enclose the outer surfaces of the electrode layers 14 and 15 or may not enclose them. In other words, the insulating film INF may be selectively formed on the surfaces of the electrode layers 14 and 15. Furthermore, the insulating film (or insulating layer) INF may be formed to expose the opposite ends of the light emitting element LD that have different polarities and may expose at least an area of each of the electrode layers 14 and 15, for example. As another example, in a further embodiment, the insulating film INF may not be provided.

If the insulating film INF is provided on the surface of the light emitting element LD, particularly, on the surface of the active layer 12, the active layer 12 may be prevented from short-circuiting with at least one electrode (not shown), e.g., at least one contact electrode connected to the opposite ends of the light emitting element LD, etc. Therefore, the electrical stability of the light emitting element LD may be secured.

Furthermore, thanks to the insulating film INF formed on the surface of the light emitting element LD, occurrence of a defect on the surface of the light emitting element LD may be minimized, whereby the lifetime and efficiency of the light emitting element LD may be improved. If the insulating film INF is formed on each light emitting element LD, even in case that light emitting elements LD are disposed adjacent to each other, an undesired short-circuiting between the light emitting elements LD may be prevented.

In an embodiment, a surface treatment process may be performed to fabricate the light emitting element LD. For example, the light emitting element LD may be surface-treated so that in case that light emitting elements LD are mixed with a fluidic solution (or solvent) and then supplied to each emission area (e.g., a light emission area of each pixel), the light emitting elements LD may be evenly distributed rather than unevenly aggregating in the solution.

A light emitting device including the light emitting element LD described above may be used in various devices including a display device which includes a light source. For instance, at least one subminiature light emitting element LD, e.g., subminiature light emitting elements LD each having a size in a range of a nanometer scale to a micrometer scale, may be disposed in each pixel area of the display panel to form a light source (or a light source unit) of the corresponding pixel using the subminiature light emitting elements LD. Furthermore, the field of application of the light emitting element LD according to the disclosure is not limited to the display device. For example, the light emitting element LD may also be used in various devices such as a lighting device which includes a light source.

Figure 4:
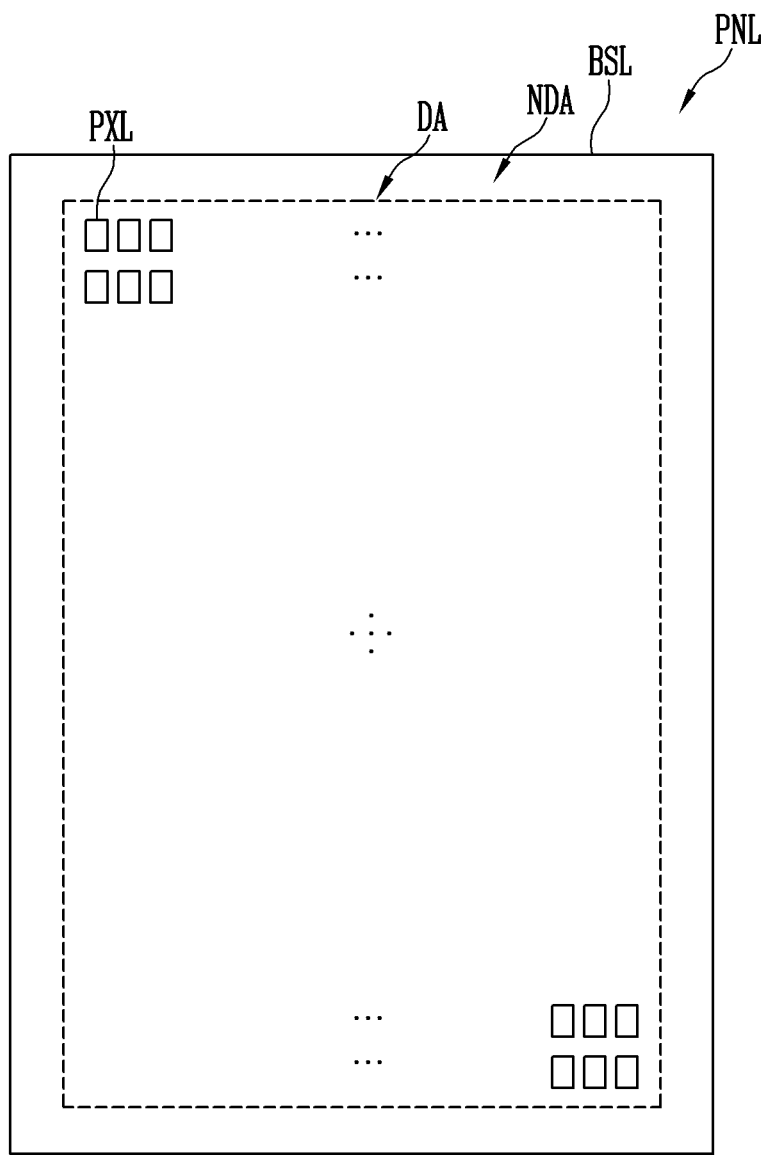
FIG. 4 is a plan view schematically illustrating a display device in accordance with an embodiment of the disclosure.

FIG. 4 is a schematic plan view illustrating a display device in accordance with an embodiment. In an embodiment, FIG. 4 illustrates a display device, particularly, a display panel PNL provided in the display device, as an example of a device which may use, as a light source, the light emitting element LD described with reference to FIGS. 1A to 3B. For instance, pixels PXL of the display panel PNL may include at least one light emitting element LD.

For the sake of explanation, FIG. 4 schematically illustrates the structure of the display panel PNL, focusing on a display area DA. In some embodiments, although not illustrated, at least one driving circuit unit (e.g., at least one of a scan driver and a data driver) and/or lines may be further provided in the display panel PNL.

Referring to FIG. 4, the display panel PNL in accordance with an embodiment may include a base layer BSL and multiple pixels PXL disposed on the base layer BSL. To be more specific, the display panel PNL and the base layer BSL for forming the display panel PNL may include a display area DA for displaying an image, and a non-display area NDA formed in a predetermined area other than the display area DA. The pixels PXL may be disposed in the display area DA of the base layer BSL.

In an embodiment, the display area DA may be disposed in a central portion of the display panel PNL, and the non-display area NDA may be disposed in a perimeter portion of the display panel PNL in such a way as to enclose the display area DA. The locations of the display area DA and the non-display area NDA are not limited thereto, and the locations thereof may be changed. Such a display area DA may form (or constitute) a screen on which an image is displayed.

The base layer BSL may form a base member of the display panel PNL. In an embodiment, the base layer BSL may be a rigid or flexible substrate or film, and the material or properties thereof are not particularly limited. For example, the base layer BSL may be a rigid substrate made of glass or reinforced glass, a soft or flexible substrate (or a thin film) made of (or include) a plastic or metal material, or at least one insulating layer, and the material and/or properties thereof are not particularly limited.

Furthermore, the base layer BSL may be transparent, but it is not limited thereto. For instance, the base layer BSL may be a transparent, translucent, opaque, or reflective base member.

An area of the base layer BSL may be defined as the display area DA in which the pixels PXL are disposed, and the other area thereof may be defined as the non-display area NDA. For example, the base layer BSL may include the display area DA including pixel areas in which the respective pixels PXL are formed, and the non-display area NDA disposed outside the display area DA. Various lines and/or internal circuit units which are electrically connected to the pixels PXL of the display area DA may be disposed in the non-display area NDA.

In an embodiment, the pixels PXL may be distributed and arranged in the display area DA. In an embodiment, the pixels PXL may be arranged in a stripe or PenTile® arrangement structure in the display area DA. However, the disclosure is not limited thereto. For example, the pixels PXL may be arranged in various known arrangement structures in the display area DA.

Each pixel PXL may include at least one light source, which is driven by a predetermined control signal (e.g., a scan signal and a data signal) and/or a predetermined power supply (e.g., a first power supply and a second power supply), for example, a light emitting element LD according to any one of the embodiments of FIGS. 1A to 3B. For example, each pixel PXL may include at least one subminiature light emitting element LD having a small size in a range of a nanometer scale to a micrometer scale. For instance, each pixel PXL may include subminiature light emitting elements LD, which are electrically connected in parallel between pixel electrodes and/or power lines to form a light source or a light source unit of the corresponding pixel PXL and each have a rod shape.

In an embodiment, each pixel PXL may be formed of an active pixel. However, the types, structures, and/or driving methods of the pixels PXL applicable to the display device according to the disclosure are not particularly limited. For example, each pixel PXL may be formed as a pixel of passive or active light emitting display devices having various known structures and/or driving methods.

Figure 5A:
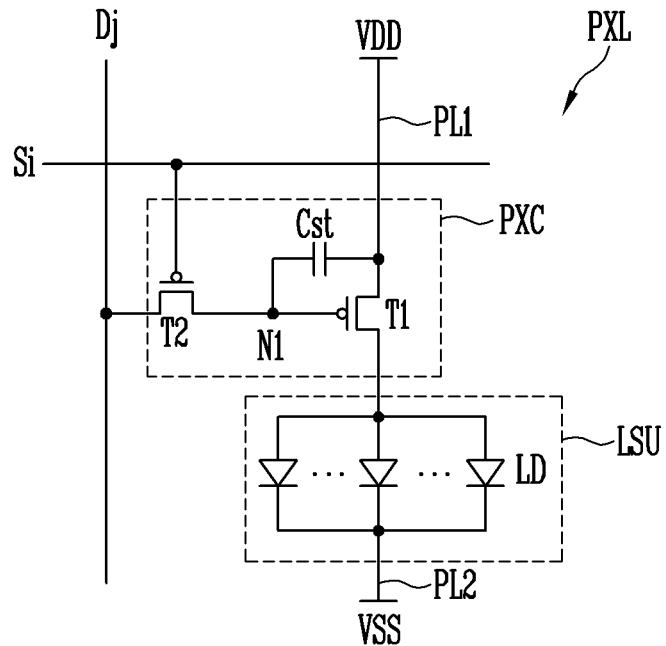
FIGS. 5A to 5C each are a circuit diagram schematically illustrating a light emitting device in accordance with an embodiment of the disclosure, for example, illustrating different examples of an active pixel constituting each light emitting device.
Figure 5B:
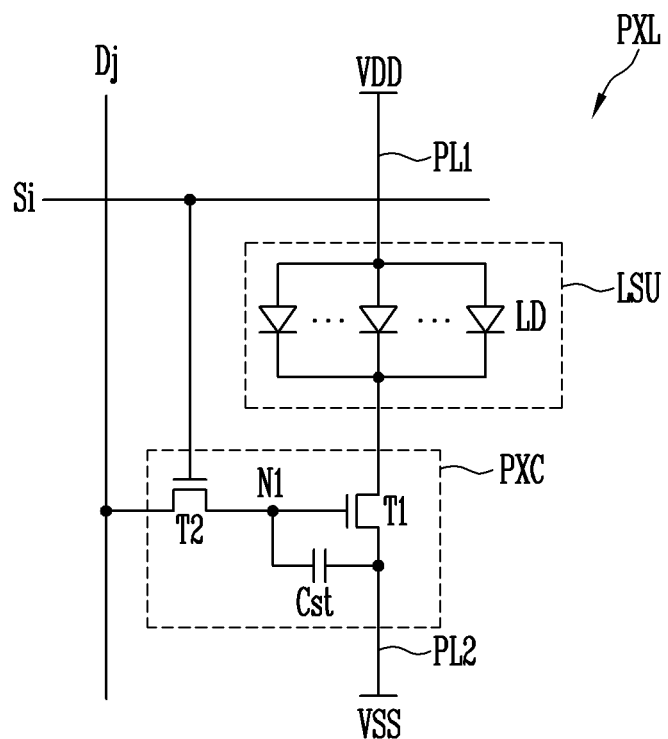
Figure 5C:
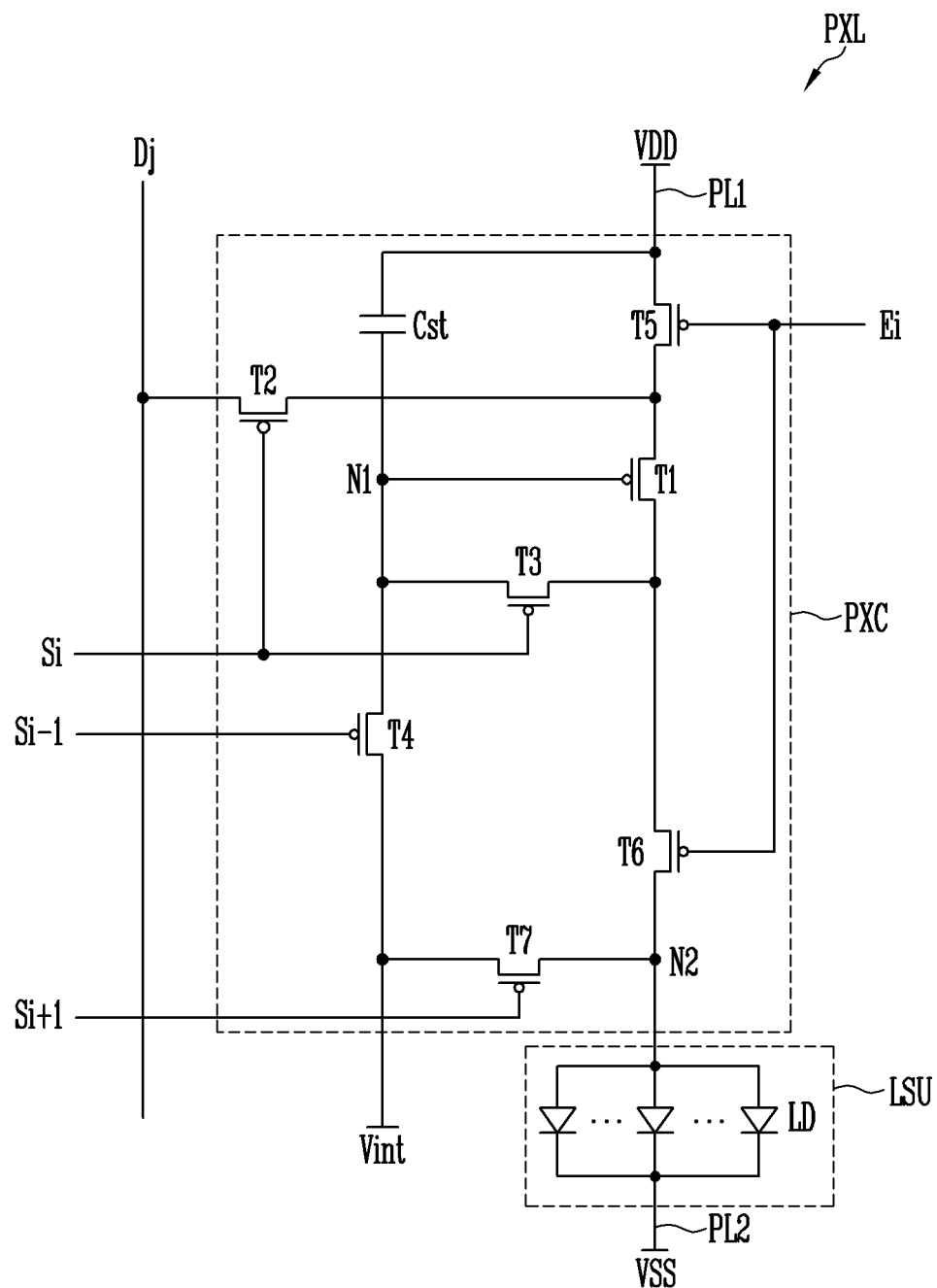

FIGS. 5A to 5C each are a schematic circuit diagram illustrating a light emitting device in accordance with an embodiment, for example, illustrating different examples of an active pixel PXL constituting (or forming) each light emitting device. In an embodiment, each pixel PXL illustrated in FIGS. 5A to 5C may be one of the pixels PXL provided in the display panel PNL of FIG. 4. The pixels PXL may have substantially the same or similar structure.

First, referring to FIG. 5A, the pixel PXL in accordance with an embodiment may include a light source unit LSU for generating light having a luminance corresponding to a data signal. The pixel PXL may further include a pixel circuit PXC configured to drive the light source unit LSU.

In an embodiment, the light source unit LSU may include light emitting elements LD that are electrically connected to each other between a first power supply VDD and a second power supply VSS. In an embodiment, the light emitting elements LD may be electrically connected in parallel to each other, but the disclosure is not limited thereto. For example, in another embodiment, the light emitting elements LD may be electrically connected in a serial/parallel hybrid structure between the first power supply VDD and the second power supply VSS.

In an embodiment, the first and second power supplies VDD and VSS may have different potentials to make it possible for the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage or higher of the light emitting elements LD during at least a light emitting period of the pixel PXL.

FIG. 5A illustrates an embodiment in which the light emitting elements LD forming the light source unit LSU of each pixel PXL are electrically connected in parallel to each other in the same direction (e.g., in a forward direction) between the first power supply VDD and the second power supply VSS, but the disclosure is not limited thereto. For example, in another embodiment, some of the light emitting elements LD may be electrically connected to each other in a first direction (e.g., the forward direction) between the first and second power supplies VDD and VSS, and the other light emitting elements may be electrically connected to each other in a second direction (e.g., the reverse direction). As another example, in another embodiment, at least one pixel PXL may include only a single light emitting element LD (e.g., single effective light emitting element LD electrically connected in the forward direction between the first and second power supplies VDD and VSS).

In an embodiment, a first end of each of the light emitting elements LD constituting each light source unit LSU may be electrically connected in common to the pixel circuit PXC through an electrode of the light source unit LSU (e.g., a first alignment electrode and/or a first contact electrode of each pixel PXL) and may be electrically connected to the first power supply VDD through the pixel circuit PXC and a first power line PL1. Furthermore, a second end of each of the light emitting elements LD may be electrically connected in common to the second power supply VSS through another electrode of the light source unit LSU (e.g., a second alignment electrode and/or a second contact electrode of each pixel PXL) and a second power line PL2.

Each light source unit LSU may emit light having a luminance corresponding to a driving current supplied thereto through the corresponding pixel circuit PXC. Therefore, a predetermined image may be displayed in the display area DA.

The pixel circuit PXC may be electrically connected to a scan line Si and a data line Dj of the corresponding pixel PXL. For example, if the pixel PXL is disposed on an i-th row (where i is a natural number) and a j-th column (where j is a natural number) of the display area DA, the pixel circuit PXC of the pixel PXL may be electrically connected to an i-th scan line Si and a j-th data line Dj of the display area DA. In an embodiment, the pixel circuit PXC may include a first transistor T1, a second transistor T2, and a storage capacitor Cst.

The first transistor T1 (or driving transistor) may be electrically connected between the first power supply VDD and the light source unit LSU. A gate electrode of the first transistor T1 may be electrically connected to a first node N1. The first transistor T1 may control a driving current supplied to the light source unit LSU in response to a voltage of the first node N1.

The second transistor T2 (or switching transistor) may be electrically connected between the data line Dj and the first node N1. A gate electrode of the second transistor T2 may be electrically connected to the scan line Si. In case that a scan signal of a gate-on voltage (e.g., a low level voltage) is supplied from the scan line Si to the second transistor T2, the second transistor T2 may be turned on to electrically connect the first node N1 to the data line Dj.

During each frame period, a data signal of a corresponding frame may be supplied to the data line Dj. The data signal may be transmitted to the first node N1 via the second transistor T2. Therefore, the storage capacitor Cst may be charged with a voltage corresponding to the data signal.

A first electrode of the storage capacitor Cst may be electrically connected to the first power supply VDD, and a second electrode thereof may be electrically connected to the first node N1. Such a storage capacitor Cst may store a voltage corresponding to the data signal supplied to the first node N1 during each frame period.

Although FIG. 5A illustrates that the transistors, e.g., the first and second transistors T1 and T2, included in the pixel circuit PXC are P-type transistors, the disclosure is not limited thereto. In other words, the first and/or second transistors T1 and/or T2 may be changed to an N-type transistor.

For example, as shown in FIG. 5B, both the first and second transistors T1 and T2 may be N-type transistors. In this case, the gate-on voltage of the scan signal for writing the data signal supplied to the data line Dj in each frame period in the pixel PXL may be a high level voltage. Similarly, the voltage of the data signal for turning on the first transistor T1 may be a voltage having a waveform opposite to that of the embodiment of FIG. 5A. For example, in the embodiment of FIG. 5B, as a gray scale value to be expressed (or displayed) increases, a data signal having a higher voltage level may be supplied to the data line Dj.

The pixel PXL illustrated in FIG. 5B may be substantially similar in configuration and operation to the pixel PXL of FIG. 5A, except that the connection positions of some circuit elements and the voltage levels of control signals (e.g., a scan signal and a data signal) are changed depending on a change in transistor type. Therefore, the detailed description of the pixel PXL of FIG. 5B will be omitted.

The structure of the pixel circuit PXC is not limited to that of the embodiments illustrated in FIGS. 5A and 5B. In other words, the pixel circuit PXC may be formed of a known pixel circuit which may have various structures and/or may be operated by various driving methods. For example, the pixel circuit PXC and the embodiment illustrated in FIG. 5C may be configured in the same manner.

Referring to FIG. 5C, the pixel circuit PXC may be electrically connected not only to a scan line Si of a corresponding horizontal line but also to at least one other scan line (or a control line). For example, the pixel circuit PXC of the pixel PXL disposed on the i-th row of the display area DA may be further electrically connected to an i−1-th scan line Si−1 and/or an i+1-th scan line Si+1. In an embodiment, the pixel circuit PXC may be electrically connected not only to the first and second power supplies VDD and VSS but also to other third power supplies. For instance, the pixel circuit PXC may be electrically connected to an initialization power supply Vint. In an embodiment, the pixel circuit PXC may include first to seventh transistors T1 to T7 and a storage capacitor Cst.

The first transistor T1 may be electrically connected between the first power supply VDD and the light source unit LSU. For example, the first electrode (e.g., a source electrode) of the first transistor T1 may be electrically connected to the first power supply VDD through the fifth transistor T5 and the first power line PL1, and the second electrode (e.g., a drain electrode) of the first transistor T1 may be electrically connected via the sixth transistor T6 to the first electrode (e.g., a first alignment electrode and/or a first contact electrode of the corresponding pixel PXL) of the light source unit LSU. A gate electrode of the first transistor T1 may be electrically connected to a first node N1. The first transistor T1 may control a driving current supplied to the light source unit LSU in response to a voltage of the first node N1.

The second transistor T2 may be electrically connected between the data line Dj and the first electrode of the first transistor T1. A gate electrode of the second transistor T2 may be electrically connected to the corresponding scan line Si. In case that a scan signal of a gate-on voltage is supplied from the scan line Si to the second transistor T2, the second transistor T2 may be turned on to electrically connect the data line Dj to the first electrode of the first transistor T1. Therefore, if the second transistor T2 is turned on, a data signal supplied from the data line Dj thereto may be transmitted to the first transistor T1.

The third transistor T3 may be electrically connected between the second electrode of the first transistor T1 and the first node N1. A gate electrode of the third transistor T3 may be electrically connected to the corresponding scan line Si. In case that a scan signal of a gate-on voltage is supplied from the scan line Si to the third transistor T3, the third transistor T3 may be turned on to electrically connect the first transistor T1 in the form of a diode.

The fourth transistor T4 may be electrically connected between the first node N1 and the initialization power supply Vint. A gate electrode of the fourth transistor T4 may be electrically connected to a preceding scan line, e.g., an i−1-th scan line Si−1. In case that a scan signal of a gate-on voltage is supplied to the i−1-th scan line Si−1, the fourth transistor T4 may be turned on to transmit the voltage of the initialization power supply Vint to the first node N1. In an embodiment, in case that the first transistor T1 is a P-type transistor, the voltage of the initialization power supply Vint for initializing the gate voltage of the first transistor T1 may be less than or equal to the lowest voltage of the data signal.

The fifth transistor T5 may be electrically connected between the first power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal of a gate-off voltage (e.g., a high level voltage) is supplied to the emission control line Ei, and the fifth transistor T5 may be turned on in other cases.

The sixth transistor T6 may be electrically connected between the first transistor T1 and a second node N2, which is electrically connected to the light source unit LSU. A gate electrode of the sixth transistor T6 may be electrically connected to a corresponding emission control line, e.g., the i-th emission control line Ei. The sixth transistor T6 may be turned off in case that an emission control signal of a gate-off voltage is supplied to the emission control line Ei, and the sixth transistor T6 may be turned on in other cases.

The seventh transistor T7 may be electrically connected between the second node N2, which is electrically connected to the first electrode (e.g., the first alignment electrode and/or the first contact electrode of the corresponding pixel PXL) of the light source unit LSU, and the initialization power supply Vint. A gate electrode of the seventh transistor T7 may be electrically connected to one of the scan lines of a subsequent stage, e.g., to the i+1-th scan line Si+1. In case that a scan signal of a gate-on voltage is supplied to the i+1-th scan line Si+1, the seventh transistor T7 may be turned on to supply the voltage of the initialization power supply Vint to the first electrode of the light source unit LSU.

Therefore, during an initialization period in case that the voltage of the initialization power supply Vint is transmitted to the light source unit LSU, the voltage of the first electrode of the light source unit LSU may be initialized. The control signal for controlling the operation of the seventh transistor T7 may be variously changed. For example, in another embodiment, the gate electrode of the seventh transistor T7 may be electrically connected to a scan line of a corresponding horizontal line, for example, an i-th scan line Si. In case that a scan signal of a gate-on voltage is supplied to the i-th scan line Si, the seventh transistor T7 may be turned on to supply the voltage of the initialization power supply Vint to the first electrode of the light source unit LSU.

The storage capacitor Cst may be electrically connected between the first power supply VDD and the first node N1. The storage capacitor Cst may store a voltage corresponding to the data signal supplied to the first node N1 during each frame period and/or to the threshold voltage of the first transistor T1.

FIG. 5C illustrates that the transistors, e.g., the first to seventh transistors T1 to T7, included in the pixel circuit PXC are P-type transistors, but the disclosure is not limited thereto. For example, at least one of the first to seventh transistors T1 to T7 may be changed to an N-type transistor.

The structure of the pixel PXL which may be applied to the disclosure is not limited to the embodiments illustrated in FIGS. 5A through 5C, and each pixel PXL may have various known structures. For example, the pixel circuit PXC included in each pixel PXL may be formed of a known pixel circuit which may have various structures and/or may be operated by various driving methods. In another embodiment, each pixel PXL may be configured in a passive light emitting display device, or the like. In this case, the pixel circuit PXC may be omitted, and both ends of each of the light emitting elements LD forming the light source unit LSU may be directly connected to the scan line Si, the data line Dj, the power line, and/or the control line.

Figure 6A:
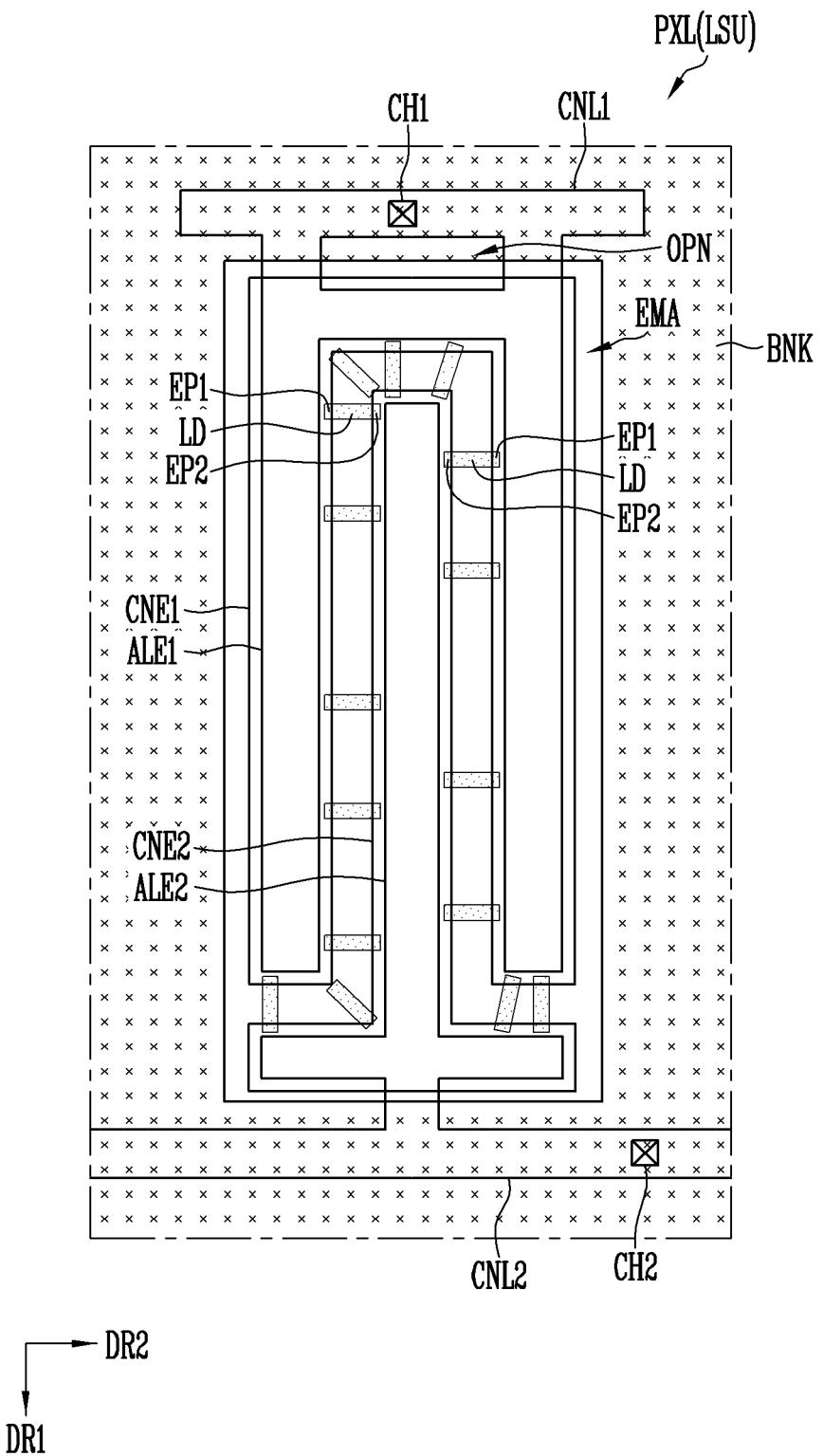
FIGS. 6A and 6B each are a plan view schematically illustrating a light emitting device in accordance with an embodiment of the disclosure, for example, illustrating examples of a pixel constituting the light emitting device.
Figure 6B:
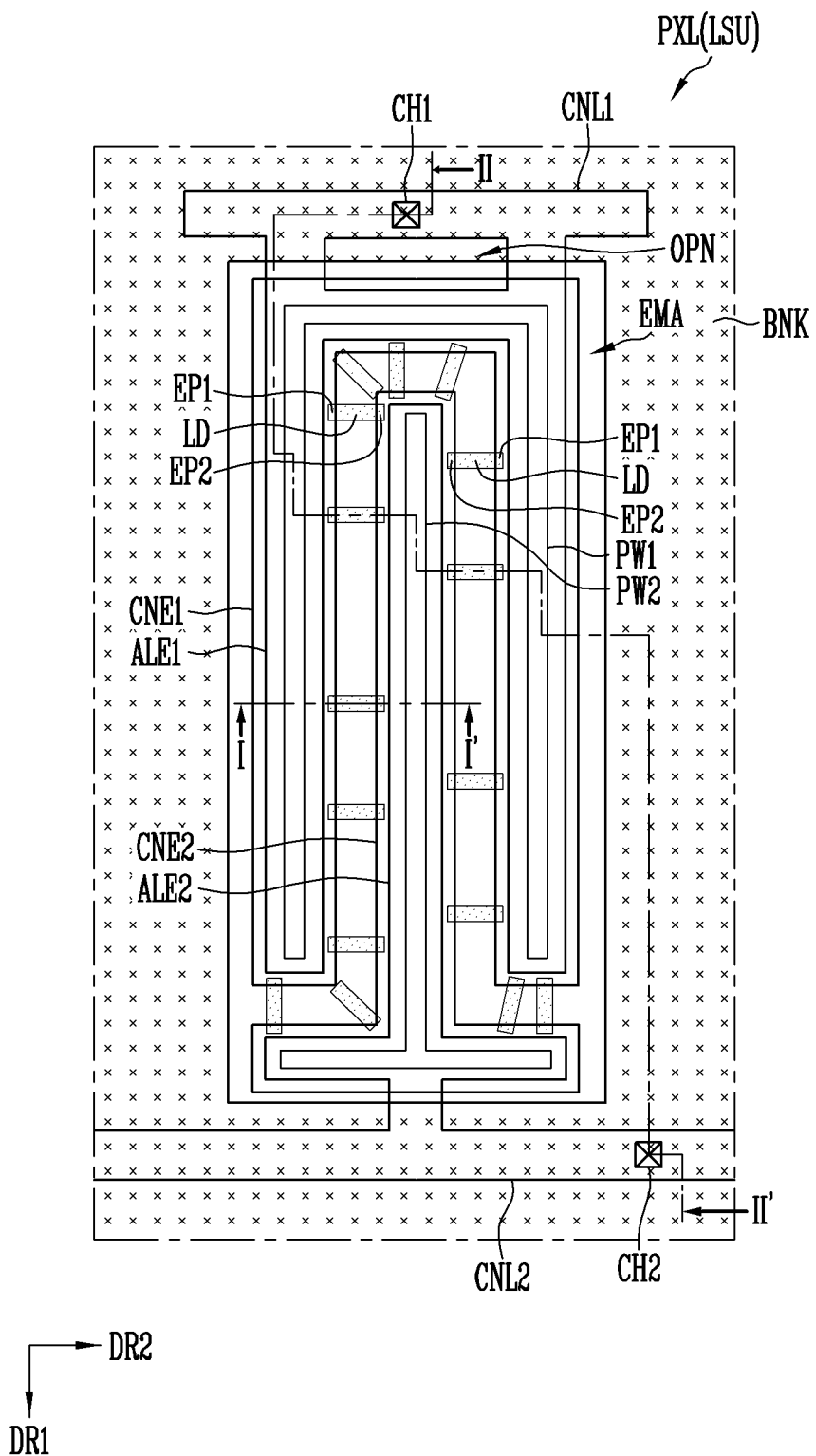
Figure 7A:
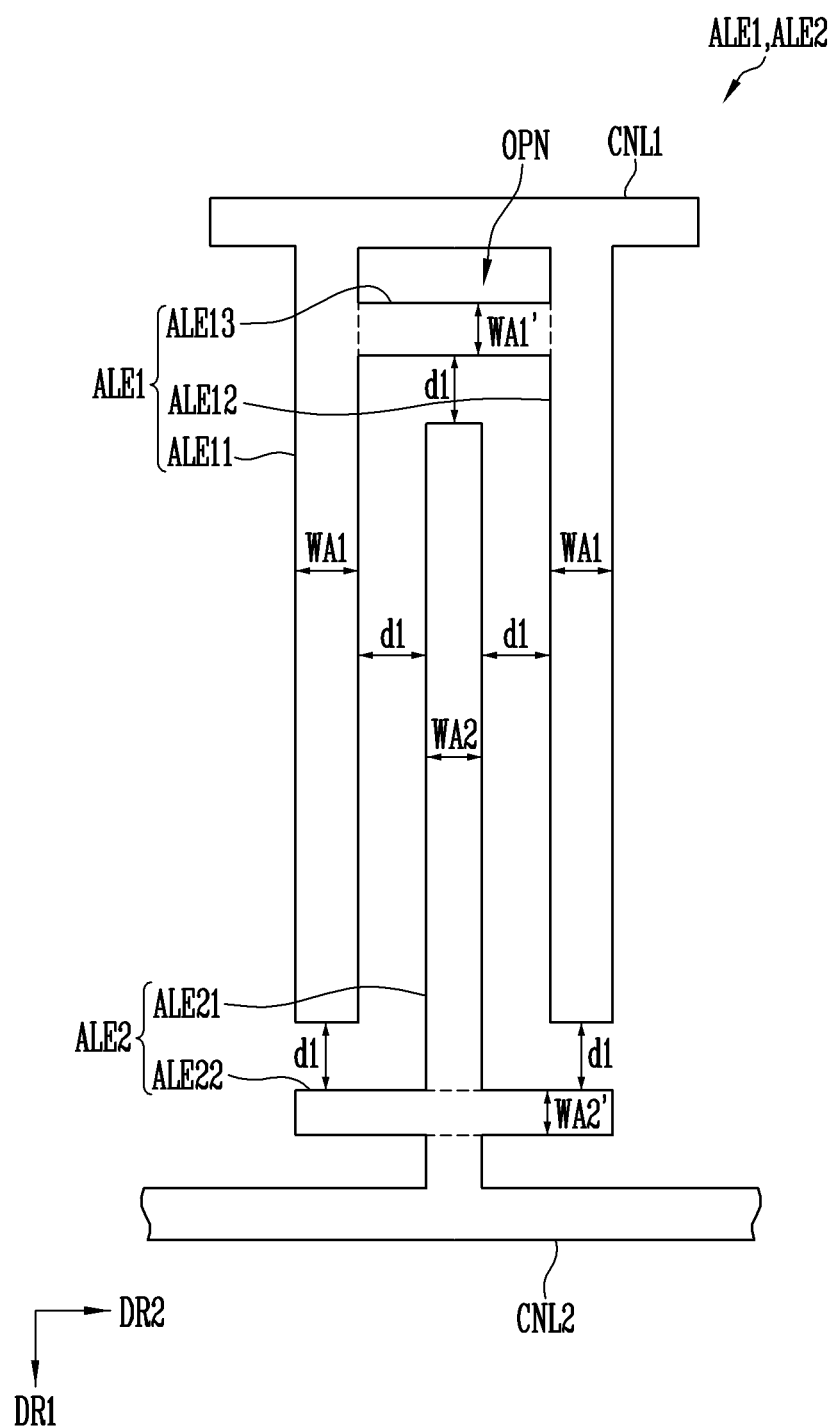
FIG. 7A is a plan view schematically illustrating first and second alignment electrodes of FIGS. 6A and 6B.
Figure 7B:
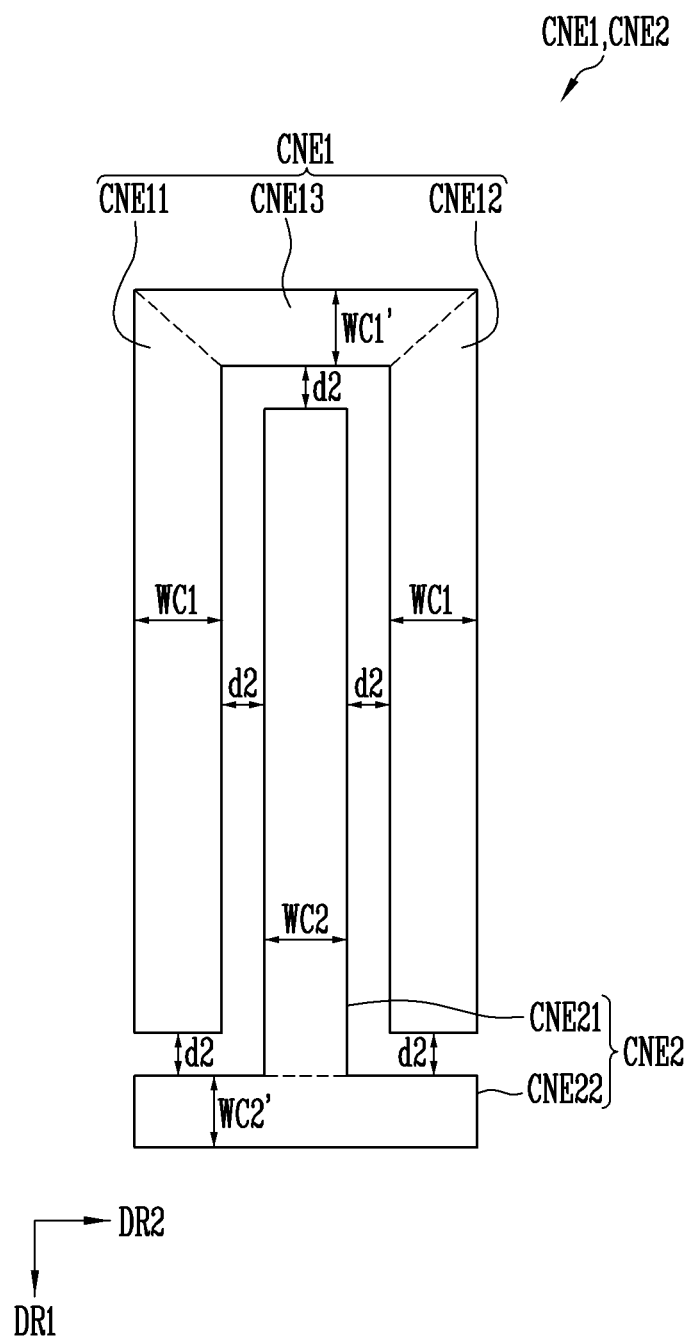
FIG. 7B is a plan view schematically illustrating first and second contact electrodes of FIGS. 6A and 6B.

FIGS. 6A and 6B each are a schematic plan view illustrating a light emitting device in accordance with an embodiment, for example, illustrating examples of a pixel PXL forming the light emitting device. In an embodiment, the embodiment of FIG. 6B may be substantially identical to that of FIG. 6A, except that the former further includes first and second partition walls PW1 and PW2 unlike the embodiment of FIG. 6A. In an embodiment, the pixel PXL may be one of the pixels PXL illustrated in FIGS. 4 to 5C, but the disclosure is not limited thereto. The pixels PXL disposed in the display area DA may have substantially the same structure, but the disclosure is not limited thereto. FIG. 7A is a schematic plan view illustrating first and second alignment electrodes ALE1 and ALE2 of FIGS. 6A and 6B, and FIG. 7B is a schematic plan view illustrating first and second contact electrodes CNE1 and CNE2 of FIGS. 6A and 6B.

FIGS. 6A to 7B illustrate only the structure of a display element layer in which the light source unit LSU of each pixel PXL is disposed. The pixel PXL may selectively further include a circuit element for controlling each light source unit LSU (e.g., at least one circuit element constituting the pixel circuit PXC of FIGS. 5A to 5C). According to an embodiment, FIGS. 6A and 6B illustrate an embodiment in which each light source unit LSU is electrically connected through first and second contact holes CH1 and CH2 to a predetermined power line (e.g., first and/or second power lines PL1 and PL2), a circuit element (e.g., at least one circuit element forming the pixel circuit PXC), and/or a signal line (e.g., the scan line Si and/or the data line Dj), but the disclosure is not limited thereto. For example, in another embodiment, the first and/or second alignment electrodes ALE1 and/or ALE2 may be directly connected to a predetermined power line and/or signal line without passing through a contact hole and/or an intermediate line.

Referring to FIGS. 6A to 7B, the light emitting device in accordance with an embodiment, e.g., the pixel PXL may include a predetermined emission area EMA, a first alignment electrode ALE1 (also referred to as a "third electrode") and a second alignment electrode ALE2 (also referred to as a "fourth electrode") disposed in the emission area EMA, and a first contact electrode CNE1 (also referred to as a "first electrode" or a "first driving electrode") and a second contact electrode CNE2 (also referred to as a "second electrode" or a "second driving electrode") overlapping the first alignment electrode ALE1 and the second alignment electrode ALE2, respectively. The first alignment electrode ALE1 and the second alignment electrode ALE2 may be disposed in each emission area EMA to be spaced apart from each other. Similarly, the first contact electrode CNE1 and the second contact electrode CNE2 may be disposed in each emission area EMA to be spaced apart from each other. In an embodiment, one of the first and second alignment electrodes ALE1 and ALE2 may be an anode electrode of the light source unit LSU, while the other electrode may be a cathode electrode of the light source unit LSU. For instance, the first alignment electrode ALE1 may be an anode electrode, and the second alignment electrode ALE2 may be a cathode electrode.

The pixel PXL may include light emitting elements LD that are electrically connected between the first and second alignment electrodes ALE1 and ALE2 and between the first and second contact electrodes CNE1 and CNE2. For instance, first ends EP1 of at least some light emitting elements LD among the light emitting elements LD disposed in each emission area EMA may be electrically connected to the first alignment electrode ALE1 and the first contact electrode CNE1, while the second ends EP2 of at least some light emitting elements LD may be electrically connected to the second alignment electrode ALE2 and the second contact electrode CNE2. Therefore, each of the light emitting elements LD (also referred to as "effective light emitting elements") that are electrically connected between the first and second alignment electrodes ALE1 and ALE2 and between the first and second contact electrodes CNE1 and CNE2 (particularly, electrically connected in the forward direction to emit light in response to a predetermined control signal and/or power supplied to the first and/or second alignment electrodes ALE1 and/or ALE2) may form the light source of the corresponding pixel PXL. These effective light emitting elements LD may be gathered to form the light source unit LSU of the corresponding pixel PXL.

The pixel PXL may selectively further include walls, for example, a first partition wall PW1 and a second partition wall PW2 which are disposed to overlap the first alignment electrode ALE1 and the second alignment electrode ALE2, respectively. For example, the pixel PXL according to an embodiment may not include the first partition wall PW1 and the second partition wall PW2, as illustrated in FIG. 6A. The pixel PXL according to another embodiment may include the first partition wall PW1 and the second partition wall PW2 disposed under the first alignment electrode ALE1 and the second alignment electrode ALE2, respectively, as illustrated in FIG. 6B.

The emission area (or light emission area) EMA may be an area in which the light emitting elements LD (particularly, the effective light emitting elements validly connected between the first and second alignment electrodes ALE1 and ALE2) forming the light source unit LSU of the pixel PXL are disposed. The emission area EMA may be enclosed by a light shielding and/or reflecting bank BNK (also referred to as a "pixel defining layer"). In other words, according to an embodiment, the emission area EMA of each pixel PXL may be defined and/or partitioned by the bank BNK.

In an embodiment, the bank BNK may be disposed to enclose the emission area EMA of each pixel PXL. For example, the bank BNK may be disposed between emission areas EMA of the pixels PXL to be located in an outer area of each pixel PXL and/or an area between adjacent pixels PXL.

The first alignment electrode ALE1 and the second alignment electrode ALE2 may be disposed in each emission area EMA and be spaced apart from each other such that at least first areas thereof face each other. The first alignment electrode ALE1 may be disposed to enclose at least one area of the second alignment electrode ALE2. For example, the first alignment electrode ALE1 may be disposed to enclose at least three surfaces of an area of the second alignment electrode ALE2.

For example, the first alignment electrode ALE1 may be disposed to enclose at least three surfaces of a main electrode part ALE21 of the second alignment electrode ALE2. For instance, the first alignment electrode ALE1 may include a first electrode part ALE11 disposed adjacent to a first side (e.g., a left side) of the main electrode part ALE21 of the second alignment electrode ALE2, a second electrode part ALE12 disposed adjacent to a second side (e.g., a right side) of the main electrode part ALE21 and disposed opposite to the first electrode part ALE11, and a third electrode part ALE13 connecting the first and second electrode parts ALE11 and ALE12 between the first and second electrode parts ALE11 and ALE12 and disposed adjacent to a third side (e.g., an upper side) of the main electrode part ALE21.

In an embodiment, the first and second electrode parts ALE11 and ALE12 of the first alignment electrode ALE1 may extend in the first direction DR1 in each emission area EMA and may be disposed to be parallel to each other. The third electrode part ALE13 of the first alignment electrode ALE1 may extend between the first and second electrode parts ALE11 and ALE12 in the second direction DR2 intersecting the first direction DR1 to connect the first and second electrode parts ALE11 and ALE12. In an embodiment, the first direction DR1 and the second direction DR2 may be orthogonal to each other, but the disclosure is not limited thereto. For example, in another embodiment, the first direction DR1 and the second direction DR2 may intersect in a diagonal direction.

However, the shape of the first alignment electrode ALE1 may be variously changed according to an embodiment. For instance, the first and second electrode parts ALE11 and ALE12 of the first alignment electrode ALE1 may extend diagonally to be symmetrical to each other with respect to the second alignment electrode ALE2. The third electrode part ALE13 of the first alignment electrode ALE1 may extend in a direction perpendicular to the first and second electrode parts ALE11 and ALE12 or may extend diagonally with respect to the first and second electrode parts ALE11 and ALE12.

In an embodiment, the first, second, and third electrode parts ALE11, ALE12, and ALE13 forming each first alignment electrode ALE1 may be integral with each other, but the disclosure is not limited thereto. At least some of the first, second, and third electrode parts ALE11, ALE12, and ALE13 may have the same width. For instance, the first and second electrode parts ALE11 and ALE12 may have the same width WA1. The third electrode part ALE13 may have a width WA1' which is equal to or different from that of the first and/or second electrode parts ALE11 and/or ALE12.

Each of the first, second, and/or third electrode parts ALE11, ALE12, and/or ALE13 may have a uniform width, but the disclosure is not limited thereto. For example, in another embodiment, each of the first, second, and/or third electrode parts ALE11, ALE12, and/or ALE13 may have a different width for each predetermined division area or may have a width that gradually changes in a direction. In other words, in the disclosure, the shape and/or structure of the first, second, and third electrode parts ALE11, ALE12, and ALE13 forming each first alignment electrode ALE1 may be changed in various ways.

In an embodiment, each of the first, second, and third electrode parts ALE11, ALE12, and ALE13 of the first alignment electrode ALE1 may be spaced apart from the second alignment electrode ALE2 by the same distance. For instance, each of the first, second, and third electrode parts ALE11, ALE12, and ALE13 may be spaced apart from the second alignment electrode ALE2 by a predetermined first distance d1.

In an embodiment, the first alignment electrode ALE1 may be electrically connected to a first connection electrode CNL1 outside the emission area EMA. In an embodiment, the first alignment electrode ALE1 and the first connection electrode CNL1 may be integral with each other, but the disclosure is not limited thereto. In case that the first alignment electrode ALE1 and the first connection electrode CNL1 are integral with each other, they may be considered as an electrode. For instance, the first connection electrode CNL1 may be considered as an electrode of the first alignment electrode ALE1.

In an embodiment, the first connection electrode CNL1 and the third electrode part ALE13 of the first alignment electrode ALE1 may extend in the same direction and may be spaced apart from each other. For instance, the first connection electrode CNL1 may be spaced apart from the third electrode part ALE13 with an opening OPN being interposed therebetween, and, similar to the third electrode part ALE13, the first connection electrode CNL1 may extend in the second direction DR2 to be parallel to the third electrode part ALE13.

Such a first alignment electrode ALE1 may be electrically connected through the first connection electrode CNL1 and/or the first contact hole CH1 to the predetermined circuit element (e.g., at least one transistor constituting the pixel circuit PXC), the power line (e.g., the first power line PL1), and/or the signal line (e.g., the scan line Si, the data line Dj, or the predetermined control line). For example, the first alignment electrode ALE1 may be electrically connected through the first connection electrode CNL1 and the first contact hole CH1 to the predetermined circuit element disposed thereunder and may be electrically connected through the circuit element to a first line. In an embodiment, the first line may be the first power line PL1 for supplying the first power supply VDD, but the disclosure is not limited thereto. For example, in another embodiment, the first line may be a signal line to which a predetermined first driving signal (e.g., a scan signal, a data signal, or a predetermined control signal, etc.) is supplied.

As another example, in another embodiment, the first alignment electrode ALE1 may be directly connected to the predetermined power line or signal line without passing through the first connection electrode CNL1, the first contact hole CH1, and/or the circuit element. In this case, the first alignment electrode ALE1 may be integral with or non-integrally connected to the predetermined power line or signal line.

The second alignment electrode ALE2 may include a main electrode part ALE21 enclosed by the first alignment electrode ALE1, and a sub-electrode part ALE22 electrically connected to the main electrode part ALE21. For example, the main electrode part ALE21 of the second alignment electrode ALE2 may be interposed between the first and second electrode parts ALE11 and ALE12 of the first alignment electrode ALE1 to be enclosed by the first, second, and third electrode parts ALE11, ALE12, and ALE13 of the first alignment electrode ALE1.

The sub-electrode part ALE22 of the second alignment electrode ALE2 may be electrically connected to a first end of the main electrode part ALE21 and may extend in a direction different from that of the main electrode part ALE21. For instance, in each emission area EMA, the main electrode part ALE21 may extend in the first direction DR1, and the sub-electrode part ALE22 may extend in the second direction DR2 intersecting the first direction DR1.

In an embodiment, the sub-electrode part ALE22 of the second alignment electrode ALE2 may be disposed such that at least one area thereof faces at least one end of the first alignment electrode ALE1. For instance, both ends of the sub-electrode part ALE22 may be disposed to face the first electrode part ALE11 and the second electrode part ALE12 of the first alignment electrode ALE1, respectively.

In an embodiment, the main electrode part ALE21 and the sub-electrode part ALE22 constituting (or forming) the second alignment electrode ALE2 may be integral with each other, but the disclosure is not limited thereto. The main electrode part ALE21 and the sub-electrode part ALE22 may have the same width or different widths. For instance, the sub-electrode part ALE22 may have a width WA2' equal to the width WA2 of the main electrode part ALE21 or have a width WA2' different from that of the main electrode part ALE21.

In an embodiment, each of the main electrode part ALE21 and the sub-electrode part ALE22 of the second alignment electrode ALE2 may have a uniform width, but the disclosure is not limited thereto. For example, in another embodiment, each of the main electrode part ALE21 and the sub-electrode part ALE22 may have a different width for each predetermined division area or may have a width that gradually changes in a direction. In other words, in the disclosure, the shape and/or structure of the main electrode part ALE21 and the sub-electrode part ALE22 constituting each second alignment electrode ALE2 may be changed in various ways.

In an embodiment, the main electrode part ALE21 and the sub-electrode part ALE22 of the second alignment electrode ALE2 may be spaced apart from the first alignment electrode ALE1 by the same distance. For instance, the main electrode part ALE21 and the sub-electrode part ALE22 may be spaced apart from the first alignment electrode ALE1 by a predetermined first distance d1.

In an embodiment, the second alignment electrode ALE2 may be electrically connected to a second connection electrode CNL2 outside the emission area EMA. The second alignment electrode ALE2 and the second connection electrode CNL2 may be integral with each other, but the disclosure is not limited thereto. In case that the second alignment electrode ALE2 and the second connection electrode CNL2 are integral with each other, they may be considered as an electrode. For instance, the second connection electrode CNL2 may be considered as an electrode of the second alignment electrode ALE2.

In an embodiment, the second connection electrode CNL2 and the sub-electrode part ALE22 of the second alignment electrode ALE2 may extend in the same direction and may be spaced apart from each other. For instance, the second connection electrode CNL2 may be spaced apart from the sub-electrode part ALE22 by a predetermined distance in the first direction DR1 and may extend in the second direction DR2 similar to the sub-electrode part ALE22 to be parallel to the sub-electrode part ALE22.

Such a second alignment electrode ALE2 may be electrically connected through the second connection electrode CNL2 and/or the second contact hole CH2 to the predetermined circuit element (e.g., at least one transistor of the pixel circuit PXC), the power line (e.g., the second power line PL2), and/or the signal line (e.g., the scan line Si, the data line Dj, or the predetermined control line). For example, the second alignment electrode ALE2 may be electrically connected through the second connection electrode CNL2 and the second contact hole CH2 to a predetermined second line disposed thereunder. In an embodiment, the second line may be the second power line PL2 for supplying the second power supply VSS, but the disclosure is not limited thereto. For example, in another embodiment, the second line may be a signal line to which a predetermined second driving signal (e.g., a scan signal, a data signal, a predetermined control signal, etc.) is supplied.

As another example, in another embodiment, the second alignment electrode ALE2 may be directly connected to the predetermined power line or signal line without passing through the second connection electrode CNL2, the second contact hole CH2, and/or the circuit element. In this case, the second alignment electrode ALE2 may be integral with or non-integrally connected to the predetermined power line or signal line.

Before the process of forming the pixel PXL, particularly before the alignment of the light emitting elements LD is completed, the first alignment electrodes ALE1 of each of the pixels PXL disposed in the display area DA may be electrically connected to each other, and the second alignment electrodes ALE2 may be electrically connected to each other. The first and second alignment electrodes ALE1 and ALE2 may be supplied with a first alignment voltage and a second alignment voltage, respectively, in the step of aligning the light emitting elements LD. In other words, in the step of aligning the light emitting elements LD, a predetermined alignment signal may be applied between the first and second alignment electrodes ALE1 and ALE2, and thereby an electric field may be generated between the first and second alignment electrodes ALE1 and ALE2. By such an electric field, the light emitting elements LD supplied to each pixel area, particularly the emission area EMA of each pixel PXL may be aligned between the first and second alignment electrodes ALE1 and ALE2. After the alignment of the light emitting elements LD is completed, the first alignment electrodes ALE1 and/or the second alignment electrodes ALE2 may be electrically disconnected from each other between the pixels PXL, and thus the pixels PXL may be individually driven.

In an embodiment, each of the first and second alignment electrodes ALE1 and ALE2 may have a single-layer or multi-layer structure. For instance, each first alignment electrode ALE1 may include at least one reflective electrode layer. The first alignment electrode ALE1 may selectively further include at least one transparent electrode layer and/or conductive encapsulation layer. Similarly, each second alignment electrode ALE2 may include at least one reflective electrode layer. The second alignment electrode ALE2 may selectively further include at least one transparent electrode layer and/or conductive encapsulation layer.

According to an embodiment, in each emission area EMA, the first and second partition walls PW1 and PW2 may be disposed under the first and second alignment electrodes ALE1 and ALE2, respectively. The first and second contact electrodes CNE1 and CNE2 may be disposed above the first and second alignment electrodes ALE1 and ALE2, respectively. According to an embodiment, the first and second contact electrodes CNE1 and CNE2 may have shapes corresponding to those of the first and second alignment electrodes ALE1 and ALE2, respectively and may be disposed in each emission area EMA to be spaced apart from each other.

The first partition wall PW1 may be disposed under the first alignment electrode ALE1 to overlap the first alignment electrode ALE1. For example, the first partition wall PW1 may be disposed under the first alignment electrode ALE1 while having a width narrower than that of the first alignment electrode ALE1. For instance, the first partition wall PW1 may be located in the first alignment electrode ALE1 in a plan view.

In an embodiment, the first partition wall PW1 may have a shape corresponding to that of the first alignment electrode ALE1. For example, similar to the first alignment electrode ALE1, the first partition wall PW1 may be shaped to enclose at least three surfaces of the main electrode part ALE21 of the second alignment electrode ALE2.

If the first partition wall PW1 is disposed under the first alignment electrode ALE1, the first alignment electrode ALE1 may protrude upwards in an area in which the first partition wall PW1 is formed. Therefore, light emitted from the first ends EP1 of the light emitting elements LD that face the first alignment electrode ALE1 may be controlled to face the front of the display device.

The second partition wall PW2 may be disposed under the second alignment electrode ALE2 to overlap the second alignment electrode ALE2. For example, the second partition wall PW2 may be disposed under the second alignment electrode ALE2 while having a width narrower than that of the second alignment electrode ALE2.

The second partition wall PW2 may have a shape corresponding to that of the second alignment electrode ALE2. For instance, the second partition wall PW2 may be located in the second alignment electrode ALE2 while having a shape corresponding to that of the second alignment electrode ALE2 in the plan view.

If the second partition wall PW2 is disposed under the second alignment electrode ALE2, the second alignment electrode ALE2 may protrude upwards in an area in which the second partition wall PW2 is formed. Therefore, light emitted from the second ends EP2 of the light emitting elements LD that face the second alignment electrode ALE2 may be controlled to face the front of the display device.

The first contact electrode CNE1 may be disposed above the first alignment electrode ALE1 to overlap the first alignment electrode ALE1. In an embodiment, the first alignment electrode ALE1 and the first contact electrode CNE1 may have shapes corresponding to each other.

For example, the first contact electrode CNE1 may include a first electrode part CNE11 overlapping the first electrode part ALE11 of the first alignment electrode ALE1 while having a shape corresponding to that of the first electrode part ALE11 of the first alignment electrode ALE1, a second electrode part CNE12 overlapping the second electrode part ALE12 of the first alignment electrode ALE1 while having a shape corresponding to that of the second electrode part ALE12 of the first alignment electrode ALE1, and a third electrode part CNE13 overlapping the third electrode part ALE13 of the first alignment electrode ALE1 while having a shape corresponding to that of the third electrode part ALE13 of the first alignment electrode ALE1.

In an embodiment, the first electrode part CNE11 of the first contact electrode CNE1 may be disposed to be adjacent to a first side (e.g., a left side) of the second alignment electrode ALE2 and the second contact electrode CNE2, and the second electrode part CNE12 of the first contact electrode CNE1 may be disposed to be adjacent to a second side (e.g., a right side) of the second alignment electrode ALE2 and the second contact electrode CNE2. The third electrode part CNE13 of the first contact electrode CNE1 may be disposed to be adjacent to a third side (e.g., an upper side) of the second alignment electrode ALE2 and the second contact electrode CNE2. In other words, the first, second, and third electrode parts CNE11, CNE12, and CNE13 of the first contact electrode CNE1 may be disposed in each emission area EMA to be located on different sides of the second alignment electrode ALE2 and the second contact electrode CNE2.

According to an embodiment, the first and second electrode parts CNE11 and CNE12 of the first contact electrode CNE1 may be symmetrical with each other with the second contact electrode CNE2 being interposed therebetween. The third electrode part CNE13 of the first contact electrode CNE1 may be provided between the first and second electrode parts CNE11 and CNE12 to connect the first and second electrode parts CNE11 and CNE12. For example, the first and second electrode parts CNE11 and CNE12 of the first contact electrode CNE1 may be disposed in the corresponding emission area EMA to extend in the first direction DR1 and be parallel to each other, and the third electrode part CNE13 of the first contact electrode CNE1 may be disposed in the emission area EMA to extend in the second direction DR2 intersecting the first direction DR1 and thus connect the first and second electrode parts CNE11 and CNE12 to each other. The third electrode part CNE13 of the first contact electrode CNE1 may extend in a direction perpendicular to the first and second electrode parts CNE11 and CNE12 or may extend diagonally with respect to the first and second electrode parts CNE11 and CNE12.

In an embodiment, the first, second, and third electrode parts CNE11, CNE12, and CNE13 constituting each first contact electrode CNE1 may be integral with each other, but the disclosure is not limited thereto. At least some of the first, second, and third electrode parts CNE11, CNE12, and CNE13 may have the same width. For instance, the first and second electrode parts CNE11 and CNE12 of the first contact electrode CNE1 may have the same width WC1. The third electrode part CNE13 may have a width WC1' which is equal to or different from that of the first and/or second electrode parts CNE11 and/or CNE12.

Each of the first, second and/or third electrode parts CNE11, CNE12, and/or CNE13 of the first contact electrode CNE1 may have a uniform width, but the disclosure is not limited thereto. For example, in another embodiment, each of the first, second, and/or third electrode parts CNE11, CNE12, and/or CNE13 may have a different width for each predetermined division area or may have a width that gradually changes in a direction. In other words, in the disclosure, the shape and/or structure of the first, second, and third electrode parts CNE11, CNE12, and CNE13 constituting each first contact electrode CNE1 may be changed in various ways.

In an embodiment, each of the first, second, and third electrode parts CNE11, CNE12, and CNE13 of the first contact electrode CNE1 may be spaced apart from the second contact electrode CNE2 by the same distance. For instance, each of the first, second, and third electrode parts CNE11, CNE12, and CNE13 may be spaced apart from the second contact electrode CNE2 by a predetermined second distance d2. According to an embodiment, the second distance d2 may be equal to or less than the length L of the light emitting elements LD, so that the first and second ends EP1 and EP2 of the light emitting elements LD may electrically contact the first and second contact electrodes CNE1 and CNE2, respectively. For instance, the second distance d2 may have a value smaller than the average length of the light emitting elements LD.

In an embodiment, the first contact electrode CNE1 may be disposed on a first area of the first alignment electrode ALE1 and the first ends EP1 of the light emitting elements LD aligned in the emission area EMA to be electrically connected to the first ends EP1 and the first alignment electrode ALE1. Through the first contact electrode CNE1, the first ends EP1 of the light emitting elements LD may be electrically connected to the first alignment electrode ALE1. The first ends EP1 of the light emitting elements LD may be reliably fixed by the first contact electrode CNE1, and thus the light emitting elements LD may be prevented from being displaced from the aligned position.

The second contact electrode CNE2 may be disposed above the second alignment electrode ALE2 to overlap the second alignment electrode ALE2. In an embodiment, the second alignment electrode ALE2 and the second contact electrode CNE2 may have shapes corresponding to each other.

For example, the second contact electrode CNE2 may include a main electrode part CNE21 that overlaps the main electrode part ALE21 while having a shape corresponding to that of the main electrode part ALE21 of the second alignment electrode ALE2, and a sub-electrode part CNE22 that overlaps the sub-electrode part ALE22 while having a shape corresponding to that of the sub-electrode part ALE22 of the second alignment electrode ALE2. In an embodiment, the main electrode part CNE21 of the second contact electrode CNE2 may be disposed between the first and second electrode parts CNE11 and CNE12 of the first contact electrode CNE1 to be enclosed by the first contact electrode CNE1. The sub-electrode part CNE22 of the second contact electrode CNE2 may be electrically connected to the first end of the main electrode part CNE21 of the second contact electrode CNE2 and extend in a direction different from that of the main electrode part CNE21 to face the first end of each of the first and second electrode parts CNE11 and CNE12 of the first contact electrode CNE1.

In an embodiment, similar to the first and second electrode parts CNE11 and CNE12 of the first contact electrode CNE1, the main electrode part CNE21 of the second contact electrode CNE2 may extend in the first direction DR1 in each emission area EMA and may be disposed parallel to the first and second electrode parts CNE11 and CNE12 of the first contact electrode CNE1. Similar to the third electrode part CNE13 of the first contact electrode CNE1, the sub-electrode part CNE22 of the second contact electrode CNE2 may extend in the second direction DR2 and may be disposed parallel to the third electrode part CNE13 of the first contact electrode CNE1.

In an embodiment, the main electrode part CNE21 and the sub-electrode part CNE22 constituting the second contact electrode CNE2 may be integral with each other, but the disclosure is not limited thereto. The main electrode part CNE21 and the sub-electrode part CNE22 may have the same width or different widths. For instance, the sub-electrode part CNE22 may have a width WC2' equal to the width WC2 of the main electrode part CNE21 or have a width WC2' different from that of the main electrode part CNE21.

In an embodiment, each of the main electrode part CNE21 and the sub-electrode part CNE22 of the second contact electrode CNE2 may have a uniform width, but the disclosure is not limited thereto. For example, in another embodiment, each of the main electrode part CNE21 and the sub-electrode part CNE22 may have a different width for each predetermined division area or may have a width that gradually changes in a direction. In other words, in the disclosure, the shape and/or structure of the main electrode part CNE21 and the sub-electrode part CNE22 constituting each second contact electrode CNE2 may be changed in various ways.

In an embodiment, the main electrode part CNE21 and the sub-electrode part CNE22 of the second contact electrode CNE2 may be spaced apart from the first contact electrode CNE1 by the same distance. For instance, the main electrode part CNE21 and the sub-electrode part CNE22 may be spaced apart from the first contact electrode CNE1 by a predetermined second distance d2.

In an embodiment, the second contact electrode CNE2 may be disposed on at least a first area of the second alignment electrode ALE2 and the second ends EP2 of the light emitting elements LD aligned in the emission area EMA to be electrically connected to the second ends EP2 and the second alignment electrode ALE2. Through the second contact electrode CNE2, the second ends EP2 of the light emitting elements LD may be electrically connected to the second alignment electrode ALE2. The second ends EP2 of the light emitting elements LD may be reliably fixed by the second contact electrode CNE2, and thus the light emitting elements LD may be prevented from being displaced from the aligned position.

The light emitting elements LD may be aligned between the first and second alignment electrodes ALE1 and ALE2. The first ends EP1 of the light emitting elements LD may be electrically connected to the first alignment electrode ALE1, and the second ends EP2 may be electrically connected to the second alignment electrodes ALE2. For example, the first ends EP1 of the light emitting elements LD may be electrically connected to the first contact electrode CNE1 to overlap the first contact electrode CNE1 and may be electrically connected through the first contact electrode CNE1 to the first alignment electrode ALE1. Similarly, the second ends EP2 of the light emitting elements LD may be electrically connected to the second contact electrode CNE2 to overlap the second contact electrode CNE2 and may be electrically connected through the second contact electrode CNE2 to the second alignment electrode ALE2.

In an embodiment, each light emitting element LD may be a rod-shaped light emitting element extending in a longitudinal direction. The light emitting element LD may include a first end EP1 that is located on a first end in the longitudinal direction and is electrically connected to the first alignment electrode ALE1, and a second end EP2 that is located on a second end in the longitudinal direction and is electrically connected to the second alignment electrode ALE2. For example, each light emitting element LD may be electrically connected between the first and second alignment electrodes ALE1 and ALE2 in an area where the first and second alignment electrodes ALE1 and ALE2 are disposed to face each other.

In an embodiment, each of the light emitting elements LD may be formed of a light emitting element which is made of a material having an inorganic crystal structure and has a subminiature size, e.g., in a range of a nanometer scale to a micrometer scale. For example, each light emitting element LD may be a subminiature rod-type light emitting element which has a diameter D and/or a length L in a range of a nanometer scale to a micrometer scale, as illustrated in FIGS. 1A to 3B. The size of the light emitting element LD may be changed in various ways depending on the design conditions of the light emitting device, e.g., the pixel PXL.

In an embodiment, the first ends EP1 of the light emitting elements LD (e.g., effective light emitting elements validly connected between the first and second alignment electrodes ALE1 and ALE2) may be electrically connected to the first alignment electrode ALE1 via the first contact electrode CNE1, and the second ends EP2 of the light emitting elements LD may be electrically connected to the second alignment electrode ALE2 via the second contact electrode CNE2. In another embodiment, at least one of the first and second ends EP1 and EP2 of the light emitting elements LD may directly contact the first and/or second alignment electrodes ALE1 and/or ALE2 and be electrically connected to the first and/or second alignment electrodes ALE1 and/or ALE2.

In an embodiment, the light emitting elements LD may be prepared in a diffused form in a predetermined solution and supplied to each emission area EMA using an inkjet method or the like. For example, the light emitting elements LD may be mixed with a volatile solvent and supplied to each emission area EMA. Here, if a predetermined alignment voltage (or "alignment signal") is applied to the first and second alignment electrodes ALE1 and ALE2, an electric field may be formed between the first and second alignment electrodes ALE1 and ALE2, whereby the light emitting elements LD may be aligned between the first and second alignment electrodes ALE1 and ALE2. After the light emitting elements LD have been aligned, the solvent may be removed by a volatilization method or other methods. In this way, the light emitting elements LD may be reliably arranged between the first and second alignment electrodes ALE1 and ALE2. The first contact electrode CNE1 and the second contact electrode CNE2 may be respectively formed on the opposite ends, for example, the first and second ends EP1 and EP2, of the light emitting elements LD. Therefore, the light emitting elements LD may be more reliably connected between the first and second alignment electrodes ALE1 and ALE2.

If the first ends EP1 of the light emitting elements LD are electrically connected to the first power supply VDD via the first alignment electrode ALE1, the pixel circuit PXC and/or the first power line PL1, and the second ends EP2 of the light emitting elements LD are electrically connected to the second power supply VSS via the second alignment electrode ALE2 and/or the second power line PL2, at least one light emitting element LD electrically connected between the first and second alignment electrodes ALE1 and ALE2 in the forward direction may emit light having luminance corresponding to the driving current supplied from the pixel circuit PXC or the like. Therefore, the pixel PXL may emit light.

At least one light emitting element LD which is not validly connected between the first and second alignment electrodes ALE1 and ALE2 may be further disposed in each emission area EMA. For example, among the area where the first and second contact electrodes CNE1 and CNE2 face each other, in an area where the first contact electrode CNE1 is bent, such as a boundary area of the first, second, and third electrode parts CNE11, CNE12, and CNE13, a distance between the first and second contact electrodes CNE1 and CNE2 may be relatively large. Therefore, at least one light emitting element LD which is not validly connected between the first and second contact electrodes CNE1 and CNE2 may be present in the corresponding area. As another example, even in an area where the first and second contact electrodes CNE1 and CNE2 are uniformly spaced by the second distance d2, in case that the light emitting element LD is misaligned or biased towards an electrode, the light emitting element LD may not be validly connected to the first and second contact electrodes CNE1 and CNE2.

As in the above-described embodiment, in case that the first alignment electrode ALE1 and the first contact electrode CNE1 include the first electrode parts ALE11 and CNE11, the second electrode parts ALE12 and CNE12, and the third electrode parts ALE13 and CNE13 and are disposed to enclose at least three surfaces of an area of each of the second alignment electrode ALE2 and the second contact electrode CNE2, the light emitting elements LD supplied to each emission area EMA and forming the light source unit LSU may be more efficiently utilized. For example, in this embodiment, the first, second, and third electrode parts CNE11, CNE12, and CNE13 of the first contact electrode CNE1 may enclose at least three surfaces of the second contact electrode CNE2 and be spaced apart from the second contact electrode CNE2 by the second distance d2 that is equal to or less than the length L of the light emitting elements LD. The first, second, and third electrode parts ALE11, ALE12, and ALE13 of the first alignment electrode ALE1 may be disposed under the first, second, and third electrode parts CNE11, CNE12, and CNE13 of the first contact electrode CNE1, respectively.

According to the above-described embodiment, in the step of aligning the light emitting elements LD by applying a predetermined alignment voltage (or alignment signal) between the first and second alignment electrodes ALE1 and ALE2 after the light emitting elements LD are supplied to each emission area EMA (or simultaneously with the supply of the light emitting elements LD), the first and second contact electrodes CNE1 and CNE2 may be formed such that a larger number of light emitting elements LD, among the light emitting elements LD arranged in an area where the electric field is formed by the alignment voltage, may be electrically connected between the first and second contact electrodes CNE1 and CNE2. For example, the first alignment electrode ALE1 and the first contact electrode CNE1 may be disposed on opposite sides (e.g., left and right sides) of the second alignment electrode ALE2 and the second contact electrode CNE2, and the first alignment electrode ALE1 and the first contact electrode CNE1 may also be disposed on a further side (e.g., an upper side) of the second alignment electrode ALE2 and the second contact electrode CNE2.

For instance, the first alignment electrode ALE1 and the first contact electrode CNE1 may include the first electrode parts ALE11 and CNE11, the second electrode parts ALE12 and CNE12, and the third electrode parts ALE13 and CNE13 disposed on the first side, the second side, and the third side of the second alignment electrode ALE2 and the second contact electrode CNE2, respectively. Furthermore, each of the first, second, and third electrode parts CNE11, CNE12, and CNE13 of the first contact electrode CNE1 may be spaced apart from the second contact electrode CNE2 by the second distance d2 that is equal to or less than the length L of the light emitting elements LD while enclosing at least three surfaces of the second contact electrode CNE2.

In other words, according to the above-described embodiment, the first and second contact electrodes CNE1 and CNE2 may be formed to enhance the utilization efficiency of the light emitting elements LD aligned in each emission area EMA. For example, the first and second contact electrodes CNE1 and CNE2 may have a shape and/or size corresponding to an area in which the electric field is formed between the first and second alignment electrodes ALE1 and ALE2, in the step of aligning the light emitting elements LD.

In the above-described embodiment, the first and second alignment electrodes ALE1 and ALE2 having a shape corresponding to the shape of the first and second contact electrodes CNE1 and CNE2 may be disposed under the first and second contact electrodes CNE1 and CNE2. Therefore, the first and second contact electrodes CNE1 and CNE2 may be disposed in an area where the electric field is formed by the alignment voltage applied to the first and second alignment electrodes ALE1 and ALE2, in the step of aligning the light emitting elements LD. Therefore, a larger number of light emitting elements LD may be reliably connected between the first and second alignment electrodes ALE1 and ALE2.

Figure 8A:
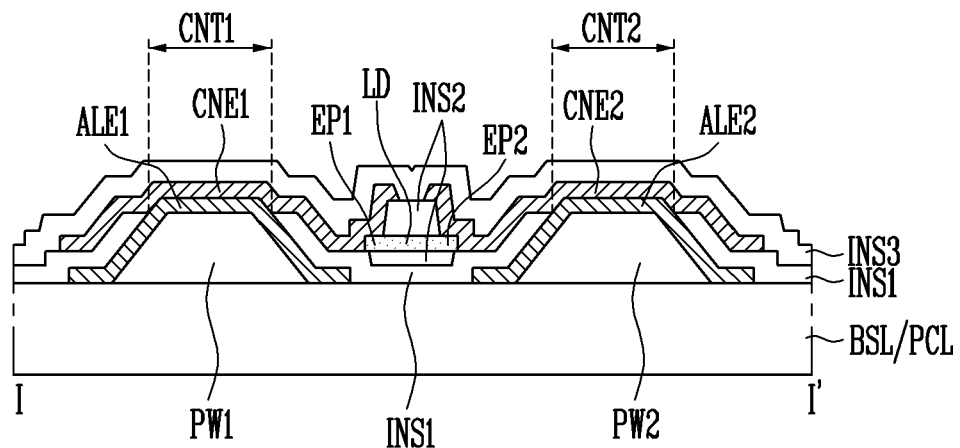
FIGS. 8A and 8B each are a cross-sectional view schematically illustrating a light emitting device in accordance with an embodiment of the disclosure, for example, illustrating examples of a cross-section taken along line I-I' of FIG. 6B.
Figure 8B:
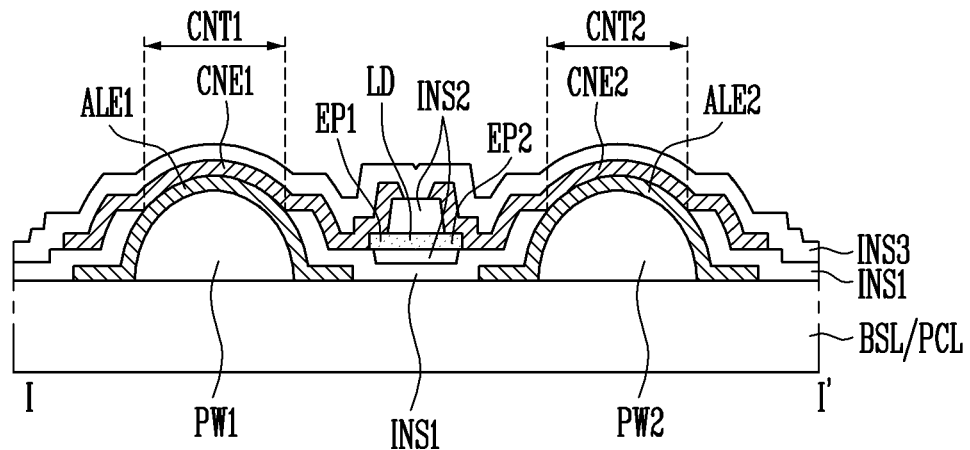

FIGS. 8A and 8B each are a schematic cross-sectional view illustrating a light emitting device in accordance with an embodiment, for example, illustrating examples of a schematic cross-section taken along line I-I' of FIG. 6B. According to an embodiment, FIGS. 8A and 8B illustrate other examples related to the shapes of the first and second partition walls PW1 and PW2 and upper layers thereof.

Figure 9A:
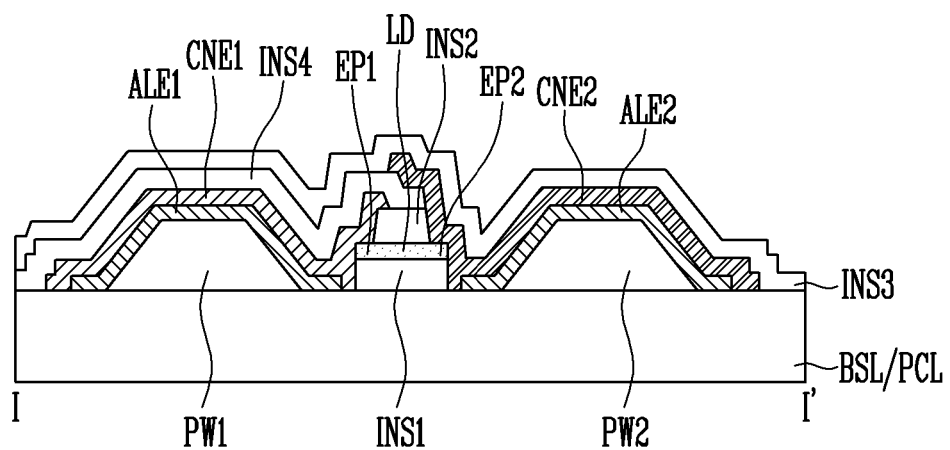
FIGS. 9A and 9B each are a cross-sectional sectional view schematically illustrating a light emitting device in accordance with an embodiment of the disclosure, for example, illustrating other examples of a cross-section taken along line I-I' of FIG. 6B.
Figure 9B:
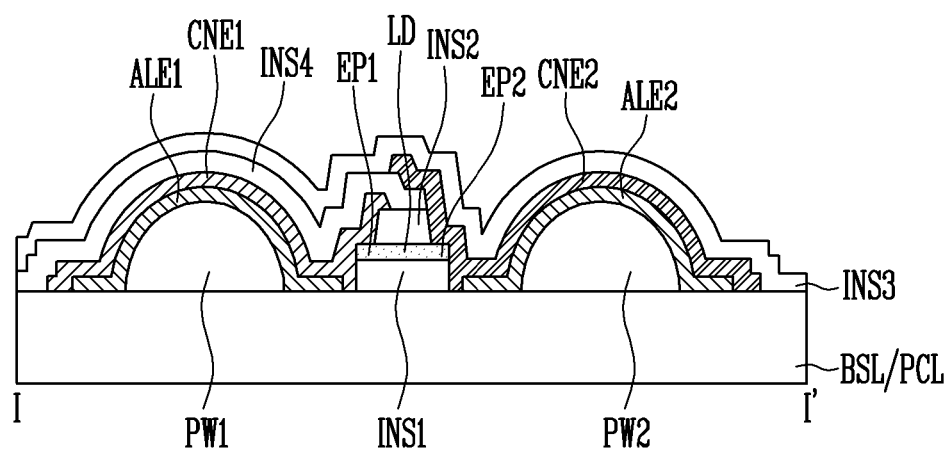

FIGS. 9A and 9B each are a schematic cross-sectional view illustrating a light emitting device in accordance with an embodiment, for example, illustrating other examples of a cross-section taken along line I-I' of FIG. 6B. According to an embodiment, FIGS. 9A and 9B illustrate other examples related to the shapes of the first and second partition walls PW1 and PW2 and upper layers thereof. FIGS. 9A and 9B illustrate embodiments different from the embodiment of FIGS. 8A and 8B, with respect to a first insulating layer INS1 and first and second contact electrodes CNE1 and CNE2.

Referring to FIGS. 6A to 9B, the light emitting device according to an embodiment, e.g., the pixel PXL may include a base layer BSL, and first and second partition walls PW1 and PW2, first and second alignment electrodes ALE1 and ALE2, a first insulating layer INS1, light emitting elements LD, a second insulating layer INS2, first and second contact electrodes CNE1 and CNE2, and a third insulating layer INS3, which are sequentially disposed and/or formed on a surface of the base layer BSL. In an embodiment, the pixel PXL may selectively further include a pixel circuit layer PCL between the base layer BSL and the first and second partition walls PW1 and PW2.

The pixel circuit layer PCL may include at least one circuit element (e.g., at least one transistor and/or capacitor) forming the pixel circuit PXC, at least one power line and/or signal line, or the like. In case that the pixel circuit PXC is omitted and a light source unit LSU is directly connected to first and second power lines PL1 and PL2 (or predetermined signal lines), the pixel circuit layer PCL may be omitted.

The first and second partition walls PW1 and PW2 may be disposed in each emission area EMA to be spaced apart from each other. The first and second partition walls PW1 and PW2 may protrude in a height direction on the base layer BSL and/or the pixel circuit layer PCL. In an embodiment, the first and second partition walls PW1 and PW2 may have substantially the same height, but the disclosure is not limited thereto.

In an embodiment, the first partition wall PW1 may be disposed between the base layer BSL and/or the pixel circuit layer PCL and the first alignment electrode ALE1. The first partition wall PW1 may be disposed to be adjacent to the first ends EP1 of the light emitting elements LD. For instance, a side of the first partition wall PW1 may be positioned at a distance adjacent to the first ends EP1 of the light emitting elements LD and thereby be disposed to face the first ends EP1.

In an embodiment, the second partition wall PW2 may be disposed between the base layer BSL and/or the pixel circuit layer PCL and the second alignment electrode ALE2. The second partition wall PW2 may be disposed to be adjacent to the second ends EP2 of the light emitting elements LD. For instance, a side of the second partition wall PW2 may be positioned at a distance adjacent to the second ends EP2 of the light emitting elements LD and thereby be disposed to face the second ends EP2.

In an embodiment, each of the first and second partition walls PW1 and PW2 may have various shapes. By way of example, as illustrated in FIGS. 8A and 9A, each of the first and second partition walls PW1 and PW2 may have a trapezoidal cross section, a width of which reduces from a bottom to a top thereof. In this case, each of the first and second partition walls PW1 and PW2 may have an inclined surface on at least one side thereof. As another example, as illustrated in FIGS. 8B and 9B, each of the first and second partition walls PW1 and PW2 may have a semi-circular or semi-elliptical cross-section, the width of which gradually reduces upwards. In this case, each of the first and second partition walls PW1 and PW2 may have a curved surface on at least one side thereof. In other words, in the disclosure, the shape of each of the first and second partition walls PW1 and PW2 may be changed in various ways rather than being particularly limited. In an embodiment, at least one of the first and second partition walls PW1 and PW2 may be omitted, or the position of each of the first and second partition walls PW1 and PW2 may be changed.

Each of the first and second partition walls PW1 and PW2 may include an insulating material having an inorganic material and/or organic material. By way of example, the first and second partition walls PW1 and PW2 may include at least one inorganic layer including various inorganic insulating materials that are known to those skilled in the art, such as $SiN_x$ or $SiO_x$. As another example, the first and second partition walls PW1 and PW2 may include at least one organic layer and/or photoresist layer containing various known organic insulating materials or may form a single- or multi-layer insulator containing organic or inorganic materials in combination. In other words, in the embodiment, the materials of the first and second partition walls PW1 and PW2 may be variously changed.

In an embodiment, each of the first and second partition walls PW1 and PW2 may function as a reflective member. For example, the first and second partition walls PW1 and PW2, along with the first and second alignment electrodes ALE1 and ALE2 provided on the first and second partition walls PW1 and PW2, may function as reflective members that guide light emitted from each light emitting element LD in a desired direction, thereby enhancing the light efficiency of the pixel PXL.

The first and second alignment electrodes ALE1 and ALE2 may be disposed on the first and second partition walls PW1 and PW2, respectively. The first and second alignment electrodes ALE1 and ALE2 may be disposed in each emission area EMA to be spaced apart from each other.

In an embodiment, at least portions of the first and second alignment electrodes ALE1 and ALE2 disposed on the first and second partition walls PW1 and PW2, respectively, may have shapes corresponding to those of the first and second partition walls PW1 and PW2, respectively. For example, the first and second alignment electrodes ALE1 and ALE2 may protrude in the height direction of the base layer BSL and may include inclined surfaces or curved surfaces corresponding to the first and second partition walls PW1 and PW2, respectively.

Each of the first and second alignment electrodes ALE1 and ALE2 may include at least one conductive material. For example, each of the first and second alignment electrodes ALE1 and ALE2 may include at least one of metal such as Ag, Mg, Al, Pt, Pd, Au, Ni, Nd, Ir, Cr, T1, or an alloy thereof, conductive oxide such as ITO, IZO, ZnO, or ITZO, and a conductive polymer such as PEDOT, but the disclosure is not limited thereto.

Each of the first and second alignment electrodes ALE1 and ALE2 may have a single-layer or multi-layer structure. By way of example, each of the first and second alignment electrodes ALE1 and ALE2 may include at least one reflective electrode layer. Each of the first and second alignment electrodes ALE1 and ALE2 may selectively further include at least one of at least one transparent electrode layer disposed above and/or under the reflective electrode layer, and at least one conductive encapsulation layer covering (or overlapping) an upper portion of the reflective electrode layer and/or the transparent electrode layer.

According to an embodiment, the reflective electrode layer of each of the first and second alignment electrodes ALE1 and ALE2 may be formed of a conductive material having a uniform reflectivity. For example, the reflective electrode layer may include at least one of metals such as Ag, Mg, Al, Pt, Pd, Au, Ni, Nd, Ir, Cr, and an alloy thereof, but the disclosure is not limited thereto. In other words, the reflective electrode layer may be formed of various reflective conductive materials. In case that the first and second alignment electrodes ALE1 and ALE2 each include a reflective electrode layer, this makes it possible for light emitted from the opposite ends, for example, the first and second ends EP1 and EP2, of each light emitting element LD to further travel in a direction (e.g., in a frontal direction) in which an image is displayed. If the first and second alignment electrodes ALE1 and ALE2 respectively include curved or inclined surfaces corresponding to the shapes of the first and second partition walls PW1 and PW2 and are respectively disposed to face the first and second ends EP1 and EP2 of the light emitting elements LD, light emitted from the first and second ends EP1 and EP2 of each light emitting element LD may be reflected by the first and second alignment electrodes ALE1 and ALE2 and thus travel in the frontal direction of the display panel PNL (e.g., in an upward direction of the base layer BSL). Therefore, the efficiency of light emitted from the light emitting elements LD may be enhanced.

The transparent electrode layer of each of the first and second alignment electrodes ALE1 and ALE2 may be formed of various transparent electrode materials. By way of example, the transparent electrode layer may include ITO, IZO, or ITZO, but the disclosure is not limited thereto. In an embodiment, each of the first and second alignment electrodes ALE1 and ALE2 may have a three-layer structure having a stacked structure of ITO/Ag/ITO. As such, if the first and second alignment electrodes ALE1 and ALE2 each have a multi-layer structure of two or more layers, a voltage drop due to signal delay (RC delay) may be reduced or minimized. Therefore, a desired voltage may be effectively transmitted to the light emitting elements LD.

If each of the first and second alignment electrodes ALE1 and ALE2 includes a conductive encapsulation layer covering (or overlapping) the reflective electrode layer and/or the transparent electrode layer, it may be possible to prevent the reflective electrode layer of the first and second alignment electrodes ALE1 and ALE2 from being damaged by defects caused by the manufacturing process of the pixel PXL. However, the conductive encapsulation layer may be selectively included in the first and second alignment electrodes ALE1 and ALE2 and may be omitted in some embodiments. The conductive encapsulation layer may be considered as a component of each of the first and second alignment electrodes ALE1 and ALE2 or be considered as a separate component disposed on the first and second alignment electrodes ALE1 and ALE2.

The first insulating layer INS1 may be disposed on an area of each of the first and second alignment electrodes ALE1 and ALE2. For example, the first insulating layer INS1 may be formed to overlap an area of each of the first and second alignment electrodes ALE1 and ALE2 and may include an opening to expose another area of each of the first and second alignment electrodes ALE1 and ALE2.

In an embodiment, the first insulating layer INS1 may be formed to primarily cover (or overlap) the first and second alignment electrodes ALE1 and ALE2 completely. After the light emitting elements LD are supplied and aligned on the first insulating layer INS1, the first insulating layer INS1 may be partially opened to expose the first and second alignment electrodes ALE1 and ALE2 in predetermined first and second contact parts CNT1 and CNT2, as illustrated in FIGS. 8A and 8B. As another example, after the supply and alignment of the light emitting elements LD are completed, the first insulating layer INS1 may be patterned in the form of an individual pattern that is locally disposed under the light emitting elements LD, as illustrated in FIGS. 9A and 9B.

For example, the first insulating layer INS1 may be interposed between the first and second alignment electrodes ALE1 and ALE2 and the light emitting elements LD and may expose at least one area of each of the first and second alignment electrodes ALE1 and ALE2. The first insulating layer INS1 may be formed to cover (or overlap) the first and second alignment electrodes ALE1 and ALE2 after the first and second alignment electrodes ALE1 and ALE2 are formed, thereby preventing the first and second alignment electrodes ALE1 and ALE2 from being damaged or preventing metal from being precipitated in a subsequent process. The first insulating layer INS1 may reliably support each light emitting element LD.

For example, light emitting elements LD may be supplied and aligned in each emission area EMA in which the first insulating layer INS1 is formed. For example, the light emitting elements LD may be supplied to each emission area EMA through an inkjet method or the like, and the light emitting elements LD may be aligned between the first and second alignment electrodes ALE1 and ALE2 by a predetermined alignment voltage (or alignment signal) applied to the first and second alignment electrodes ALE1 and ALE2.

The second insulating layer INS2 may be disposed on the light emitting elements LD, particularly, the light emitting elements LD aligned between the first and second alignment electrodes ALE1 and ALE2 and may expose the first and second ends EP1 and EP2 of the light emitting elements LD. For example, the second insulating layer INS2 may be partially disposed only on first areas of the light emitting elements LD without overlapping the first and second ends EP1 and EP2 of the light emitting elements LD. The second insulating layer INS2 may be formed in an independent pattern in each emission area EMA, but the disclosure is not limited thereto. As illustrated in FIGS. 8A and 8B, in case that a space is present between the first insulating layer INS1 and each of the light emitting elements LD before the second insulating layer INS2 is formed, the space may be filled in the process of forming the second insulating layer INS2. Therefore, the light emitting elements LD may be more reliably supported.

The first and second contact electrodes CNE1 and CNE2 may be disposed on the first and second alignment electrodes ALE1 and ALE2 and the first and second ends EP1 and EP2 of the light emitting elements LD. In an embodiment, the first and second contact electrodes CNE1 and CNE2 may be disposed on the same layer as illustrated in FIGS. 8A and 8B. In this case, the first and second contact electrodes CNE1 and CNE2 may be formed of the same conductive material by the same process, but the disclosure is not limited thereto.

In another embodiment, the first and second contact electrodes CNE1 and CNE2 may be disposed on different layers as illustrated in FIGS. 9A and 9B. In this case, the first and second contact electrodes CNE1 and CNE2 may be formed using the same conductive material or different conductive materials by different processes. In case that the first and second contact electrodes CNE1 and CNE2 are disposed on different layers, at least one insulating layer (e.g., a fourth insulating layer INS4) may be formed on the contact electrode disposed on a lower layer, e.g., the first contact electrode CNE1.

The first and second contact electrodes CNE1 and CNE2 may electrically connect the first and second ends EP1 and EP2 of the light emitting elements LD to the first and second alignment electrodes ALE1 and ALE2, respectively.

For example, the first contact electrode CNE1 may be disposed on the first alignment electrode ALE1 to electrically contact the first alignment electrode ALE1. For instance, the first contact electrode CNE1 may be disposed to electrically contact the first alignment electrode ALE1 on an area (e.g., a first contact part CNT1) of the first alignment electrode ALE1 that is not overlapped by the first insulating layer INS1. The first contact electrode CNE1 may be disposed on first ends EP1 to electrically contact at least one light emitting element LD adjacent to the first alignment electrode ALE1, for instance, the first ends EP1 of the light emitting elements LD. In other words, the first contact electrode CNE1 may be disposed to cover (or overlap) the first ends EP1 of the light emitting elements LD and at least one area of the first alignment electrode ALE1 corresponding thereto. Therefore, the first ends EP1 of the light emitting elements LD may be electrically connected to the first alignment electrode ALE1.

Similarly, the second contact electrode CNE2 may be disposed on the second alignment electrode ALE2 to electrically contact each second alignment electrode ALE2. For instance, the second contact electrode CNE2 may be disposed to electrically contact the second alignment electrode ALE2 on an area (e.g., a second contact part CNT2) of the second alignment electrode ALE2 that is not covered (or overlapped) by the first insulating layer INS1. The second contact electrode CNE2 may be disposed on second ends EP2 to electrically contact at least one light emitting element LD adjacent to the second alignment electrode ALE2, for instance, the second ends EP2 of the light emitting elements LD. In other words, the second contact electrode CNE2 may be disposed to overlap the second ends EP2 of the light emitting elements LD and at least one area of the second alignment electrode ALE2 corresponding thereto. Therefore, the second ends EP2 of the light emitting elements LD may be electrically connected to the second alignment electrode ALE2.

The third insulating layer INS3 may be formed and/or disposed on a surface of the base layer BSL on which the first and second partition walls PW1 and PW2, the first and second alignment electrodes ALE1 and ALE2, the light emitting elements LD, and the first and second contact electrodes CNE1 and CNE2 are formed, so as to overlap the first and second partition walls PW1 and PW2, the first and second alignment electrodes ALE1 and ALE2, the light emitting elements LD, and the first and second contact electrodes CNE1 and CNE2. The third insulating layer INS3 may include a thin film encapsulation layer containing at least one inorganic layer and/or organic layer, but the disclosure is not limited thereto. In an embodiment, at least one overcoat layer (not shown) may be further disposed above the third insulating layer INS3.

In an embodiment, each of the first to fourth insulating layers INS1, INS2, INS3, and INS4 may have a single-layer or multi-layer structure and may include at least one inorganic insulating material and/or organic insulating material. For example, each of the first to fourth insulating layers INS1, INS2, INS3, and INS4 may include various kinds of known organic/inorganic insulating materials including $SiN_x$, and the material of each of the first to fourth insulating layers INS1, INS2, INS3, and INS4 is not particularly limited. The first to fourth insulating layers INS1, INS2, INS3, and INS4 may include respective different insulating materials, or at least some of the first to fourth insulating layers INS1, INS2, INS3, and INS4 may include the same insulating material.

Figure 10:
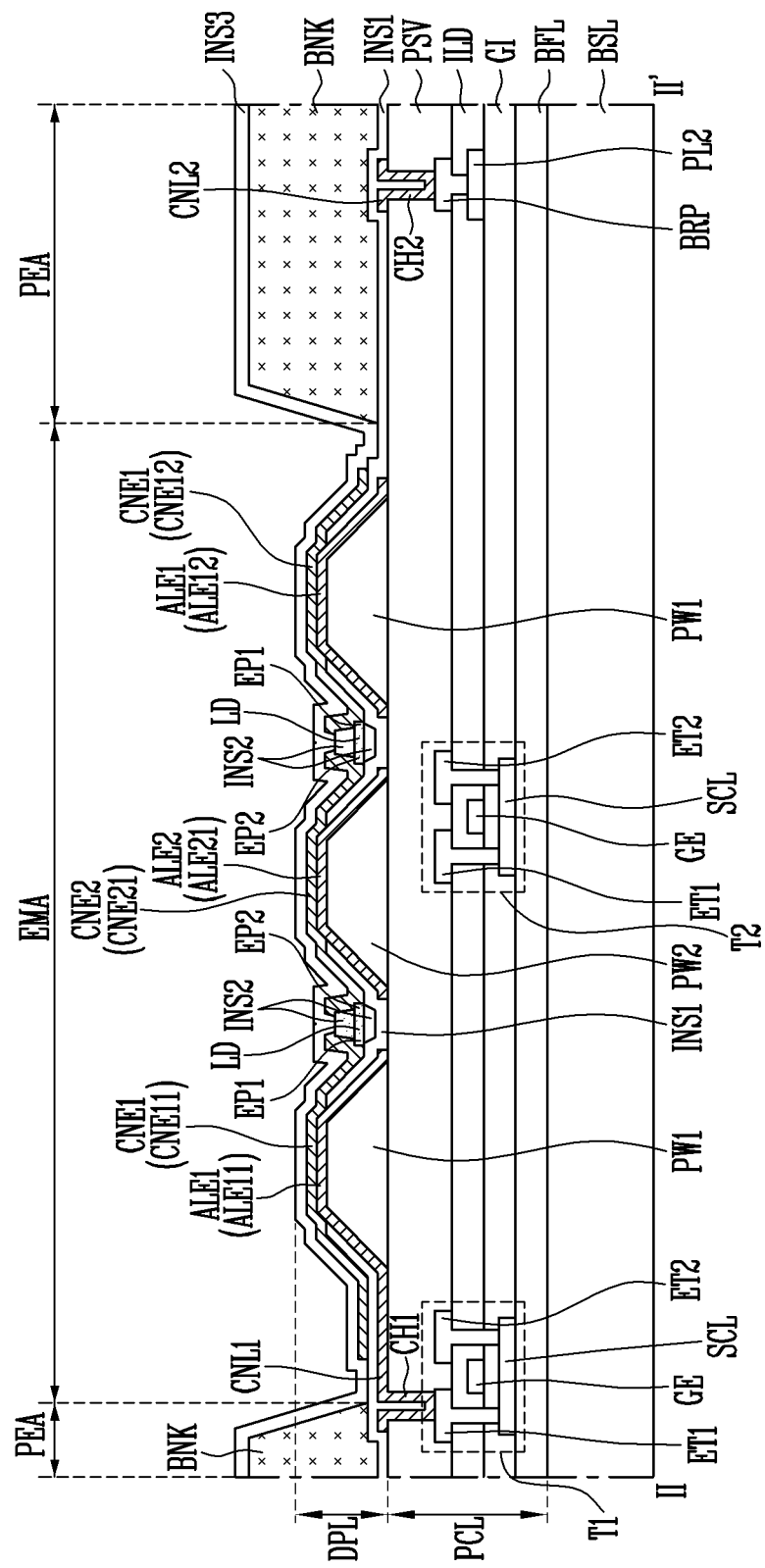
FIG. 10 is a cross-sectional view schematically illustrating a light emitting device in accordance with an embodiment of the disclosure, for example, illustrating an example of a cross-section corresponding to line II-IF of FIG. 6B.

FIG. 10 is a schematic sectional view illustrating a light emitting device in accordance with an embodiment, for example, illustrating an example of a cross-section taken along line II-IT of FIG. 6B. FIG. 10 illustrates some circuit elements in an embodiment disposed in the pixel circuit layer PCL and/or lines, and a connecting structure of the pixel circuit layer PCL and a display element layer DPL provided thereon (e.g., a layer in which the light emitting elements LD forming the light source unit LSU are disposed). In FIG. 10, the same reference numerals are used to designate components similar or identical to those of the embodiments of FIGS. 6A to 9B, and detailed descriptions thereof will be omitted.

Referring to FIGS. 6A to 10, the light emitting device in accordance with an embodiment may include a pixel circuit layer PCL disposed between the base layer BSL and the display element layer DPL. For example, the pixel circuit layer PCL may be formed on a surface of the base layer BSL, and the display element layer DPL may be formed on the surface of the base layer BSL on which the pixel circuit layer PCL has been formed.

The pixel circuit layer PCL may include a pixel circuit for controlling the display element layer DPL, e.g., a pixel circuit PXC illustrated in FIGS. 5A to 5C and/or lines electrically connected thereto. For example, the pixel circuit layer PCL may include the first and second transistors T1 and T2 of FIG. 5A. The pixel circuit layer PCL may further include a storage capacitor Cst illustrated in FIG. 5A, various signal lines (e.g., the scan line Si and the data line Dj) electrically connected to each pixel circuit PXC, and various power lines (e.g., the first power line PL1 and the second power line PL2) electrically connected to the pixel circuit PXC and/or the light source unit LSU.

In an embodiment, transistors, e.g., first and second transistors T1 and T2, provided in each pixel circuit PXC may have substantially an identical or similar sectional structure. However, the disclosure is not limited thereto. For example, in another embodiment, at least some of the transistors may have different types and/or structures.

The pixel circuit layer PCL may include insulating layers. For example, the pixel circuit layer PCL may include a buffer layer BFL, a gate insulating layer GI, an interlayer insulating layer ILD, and a passivation layer PSV, which are successively stacked on a surface of the base layer BSL. The pixel circuit layer PCL may selectively further include at least one light shielding pattern (not illustrated) disposed under at least some transistors.

The buffer layer BFL may prevent impurities from diffusing into each circuit element. The buffer layer BFL may be formed of a single layer or may be formed of multiple layers having two or more layers. In the case where the buffer layer BFL has the multilayer structure, the respective layers may be formed of the same material or different materials. In an embodiment, the buffer layer BFL may be omitted.

Each of the first and second transistors T1 and T2 may include a semiconductor layer SCL, a gate electrode GE, and first and second transistor electrodes ET1 and ET2. Although FIG. 10 illustrates an embodiment in which each of the first and second transistors T1 and T2 includes the first transistor electrode ET1 and the second transistor electrode ET2 that are formed separately from the semiconductor layer SCL, the disclosure is not limited thereto. For example, in an embodiment, the first and/or second transistor electrode ET1 and/or ET2 provided in at least one transistor disposed in each pixel area may be integral with the corresponding semiconductor layer SCL.

The semiconductor layer SCL may be disposed on the buffer layer BFL. For example, the semiconductor layer SCL may be disposed between the gate insulating layer GI and the base layer BSL on which the buffer layer BFL is formed. The semiconductor layer SCL may include a first area which contacts each first transistor electrode ET1, a second area which contacts each second transistor electrode ET2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, or the like. The channel region of the semiconductor layer SCL may be an intrinsic semiconductor, which is an undoped semiconductor pattern. Each of the first and second areas of the semiconductor layer SCL may be a semiconductor pattern doped with a predetermined impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD to overlap at least a portion of the semiconductor layer SCL.

The first and second transistor electrodes ET1 and ET2 may be disposed on each semiconductor layer SCL and gate electrode GE with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically connected to each semiconductor layer SCL. For example, the first and second transistor electrodes ET1 and ET2 may be electrically connected to the first and second areas of the semiconductor layer SCL through corresponding contact holes which pass through the gate insulating layer GI and the interlayer insulating layer ILD.

At least one transistor provided in the pixel circuit PXC may be electrically connected to a pixel electrode. For instance, one of the first and second transistor electrodes ET1 and ET2 of the first transistor T1 may be electrically connected to the first alignment electrode ALE1 and/or the first connection electrode CNL1 of the light source unit LSU disposed on the passivation layer PSV, through the first contact hole CH1 passing through the passivation layer PSV.

In an embodiment, at least one signal line and/or power line that is electrically connected to each pixel PXL may be disposed on a layer identical with that of one electrode of each of the circuit elements that form the pixel circuit PXC. For example, the second power line PL2 for supplying the second power supply VSS and the gate electrodes GE of the first and second transistors T1 and T2 may be disposed on a same layer, and the second power line PL2 may be electrically connected to the second alignment electrode ALE2 and/or the second connection electrode CNL2 of the light source unit LSU that is disposed on the passivation layer PSV, through a bridge pattern BRP disposed on the same layer as that of the first and second transistor electrodes ET1 and ET2 and through at least one second contact hole CH2 passing through the passivation layer PSV. However, the structures and/or positions of the second power line PL2, etc. may be changed in various ways.

In an embodiment, the display element layer DPL may include the light source unit LSU of each of the pixels PXL. For example, the display element layer DPL may include at least one pair of first and second alignment electrodes ALE1 and ALE2, and at least one light emitting element LD electrically connected between the first and second alignment electrodes ALE1 and ALE2. The display element layer DPL may further include at least one conductive layer and/or insulating layer, etc.

For example, the display element layer DPL may include the first and second partition walls PW1 and PW2 disposed in each emission area EMA, the first and second alignment electrodes ALE1 and ALE2 disposed on the first and second partition walls PW1 and PW2, light emitting elements LD disposed between the first and second alignment electrodes ALE1 and ALE2, and the first and second contact electrodes CNE1 and CNE2 disposed on the first and second ends EP1 and EP2 of each of the light emitting elements LD. The display element layer DPL may include the first to third insulating layers INS1, INS2, and INS3 that are successively arranged, and may selectively further include the fourth insulating layer INS4 illustrated in FIGS. 9A and 9B. Since the embodiments related to the structure of the display element layer DPL have been described in detail with reference to FIGS. 6A to 9B, detailed descriptions thereof will be omitted.

In an embodiment, a bank BNK may be disposed in a peripheral area PEA outside the emission area EMA. For example, the bank BNK may be disposed between the pixels PXL to enclose the emission area EMA of each pixel PXL.

The bank BNK may be disposed on the periphery of the display area DA to enclose the display area DA in which the pixels PXL are disposed.

The bank BNK may be a structure that defines the emission area EMA of each pixel PXL and may be, for example, a pixel defining layer. The bank BNK may include at least one light shielding and/or reflecting material to prevent light leakage between adjacent pixels PXL.

In an embodiment, the bank BNK may be disposed between the first insulating layer INS1 and the third insulating layer INS3 in the peripheral area PEA outside the emission area EMA, but the disclosure is not limited thereto. For example, the position (e.g., a position for each layer) of the bank BNK may be changed in various ways.

Figure 11:
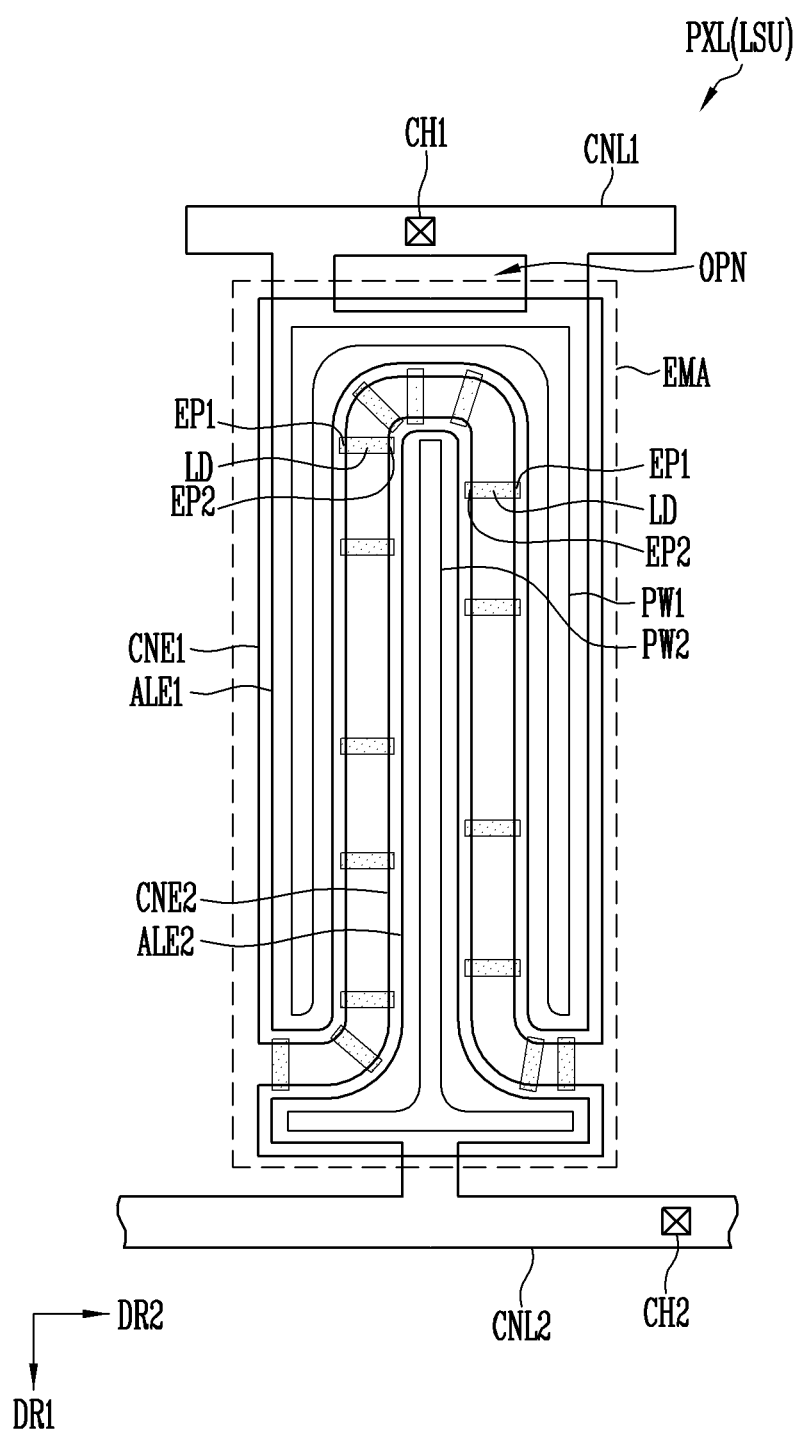
FIG. 11 is a plan view schematically illustrating a light emitting device in accordance with an embodiment of the disclosure, for example, illustrating an example of a pixel constituting the light emitting device.
Figure 12A:
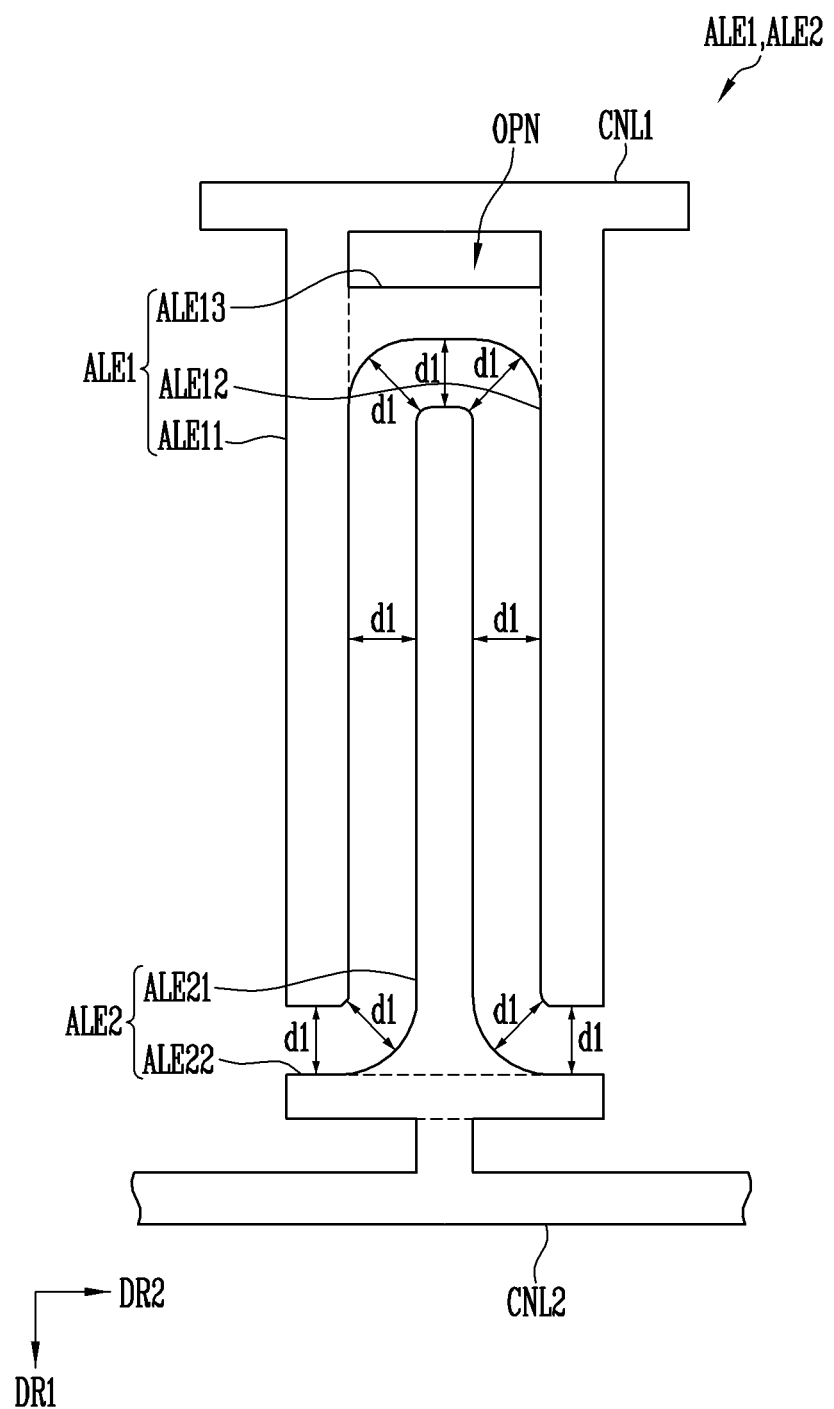
FIG. 12A is a plan view schematically illustrating first and second alignment electrodes of FIG. 11.
Figure 12B:
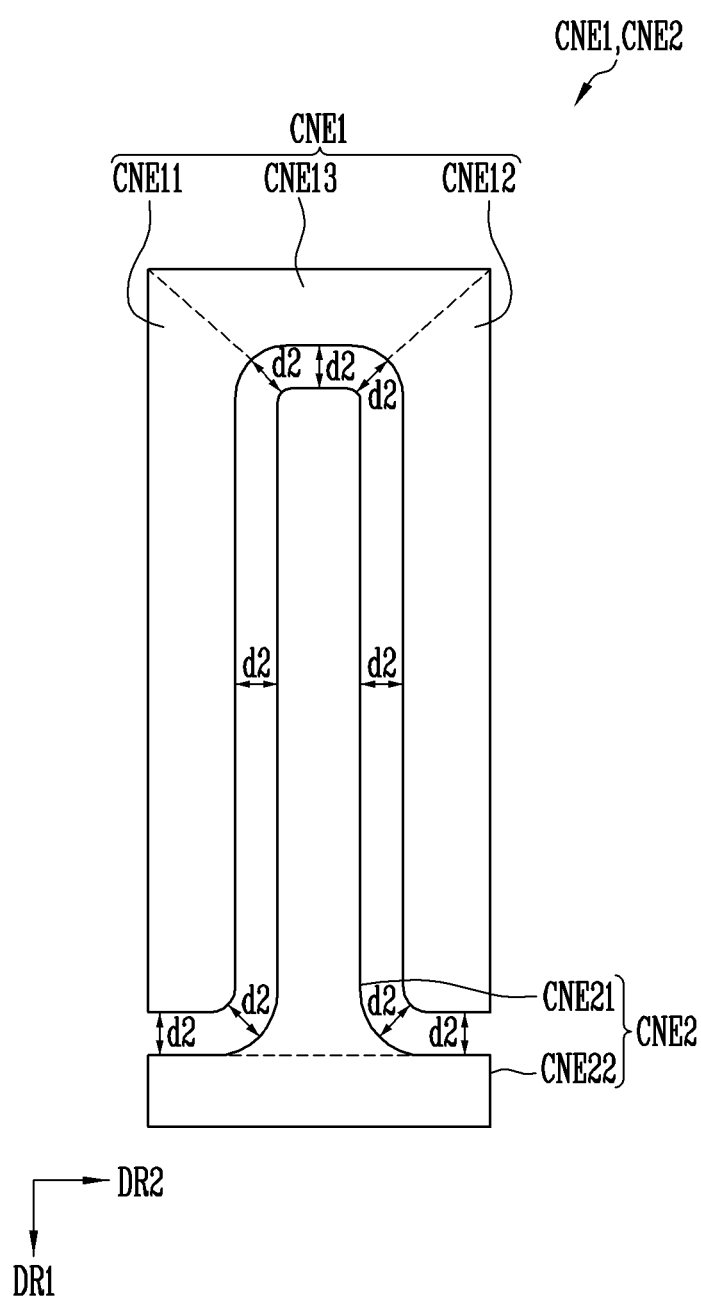
FIG. 12B is a plan view schematically illustrating first and second contact electrodes of FIG. 11.

FIG. 11 is a schematic plan view illustrating a light emitting device in accordance with an embodiment, for example, illustrating an example of a pixel PXL forming the light emitting device. FIG. 12A is a schematic plan view illustrating first and second alignment electrodes ALE1 and ALE2 of FIG. 11, and FIG. 12B is a schematic plan view illustrating first and second contact electrodes CNE1 and CNE2 of FIG. 11. In an embodiment, FIGS. 11 to 12B illustrate the modification of the pixel PXL according to the embodiments of FIGS. 6A to 7B. In detail, FIGS. 11 to 12B illustrate the modification of the embodiments of FIGS. 6A to 7B related to the shape of the electrodes disposed in each pixel PXL.

The plan views according to the embodiments of FIGS. 11 to 12B and other subsequent embodiments mainly illustrate the shape of the electrodes, and the above-described bank BNK or the like is omitted. Even in the subsequent embodiments, the emission area EMA of each pixel PXL may be enclosed by the bank BNK. In the embodiment of FIGS. 11 to 12B and other subsequent embodiments, components that are identical or similar to those of at least one above-described embodiment will be denoted by the same reference numerals, and detailed descriptions thereof will be omitted.

Referring to FIGS. 11 to 12B, the first alignment electrode ALE1 may be bent so that an area facing the second alignment electrode ALE2 has a curved surface at a boundary between the first, second, and third electrode parts ALE11, ALE12, and ALE13. For example, the first alignment electrode ALE1 may have a gently curved surface instead of being bent so that the inner surface thereof has a predetermined angle at the boundary between the first, second, and third electrode parts ALE11, ALE12, and ALE13. In an embodiment, the first partition wall PW1 may be bent so that at least one area has a curved surface to correspond to the first alignment electrode ALE1, but the disclosure is not limited thereto. For example, a part of the first electrode facing the second electrode at a boundary between the first, second, and third electrode parts may be curved, and a part of the second electrode facing the part of the first electrode may be curved and correspond to a shape of the first electrode.

The second alignment electrode ALE2 may have a shape corresponding to that of the first alignment electrode ALE1. For example, the second alignment electrode ALE2 may have a curved surface corresponding to the shape of the first alignment electrode ALE1 in an area facing the curved surface of the first alignment electrode ALE1. In an embodiment, the second partition wall PW2 may be bent so that at least one area has a curved surface to correspond to the second alignment electrode ALE2, but the disclosure is not limited thereto.

According to an embodiment, the first and second alignment electrodes ALE1 and ALE2 may be spaced apart from each other by a uniform distance over the entire area where they face each other. For example, the first and second alignment electrodes ALE1 and ALE2 may be uniformly spaced apart from each other by a first distance d1 even in an area corresponding to the boundary between the first, second, and third electrode parts ALE11, ALE12, and ALE13 of the first alignment electrode ALE1. The first and second alignment electrodes ALE1 and ALE2 may be uniformly spaced apart from each other by a first distance d1 even in an area corresponding to the boundary between the main electrode part ALE21 and the sub-electrode part ALE22 of the second alignment electrode ALE2.

Similarly, the first contact electrode CNE1 may be bent so that an area facing the second contact electrode CNE2 has a curved surface at a boundary between the first, second, and third electrode parts CNE11, CNE12, and CNE13. For example, the inner surface of the first contact electrode CNE1 may have a gently curved surface at the boundary between the first, second, and third electrode parts CNE11, CNE12, and CNE13.

The second contact electrode CNE2 may have a shape corresponding to that of the first contact electrode CNE1. For example, the second contact electrode CNE2 may have a curved surface corresponding to the shape of the first contact electrode CNE1 in an area facing the curved surface of the first contact electrode CNE1.

According to an embodiment, the first and second contact electrodes CNE1 and CNE2 may be spaced apart from each other by a uniform distance over the entire area where they face each other. For example, the first and second contact electrodes CNE1 and CNE2 may be uniformly spaced apart from each other by a second distance d2 even in an area corresponding to the boundary between the first, second, and third electrode parts CNE11, CNE12, and CNE13 of the first contact electrode CNE1. The first and second contact electrodes CNE1 and CNE2 may be uniformly spaced by a second distance d2 even in an area corresponding to the boundary between the main electrode part CNE21 and the sub-electrode part CNE22 of the second contact electrode CNE2.

Figure 13:
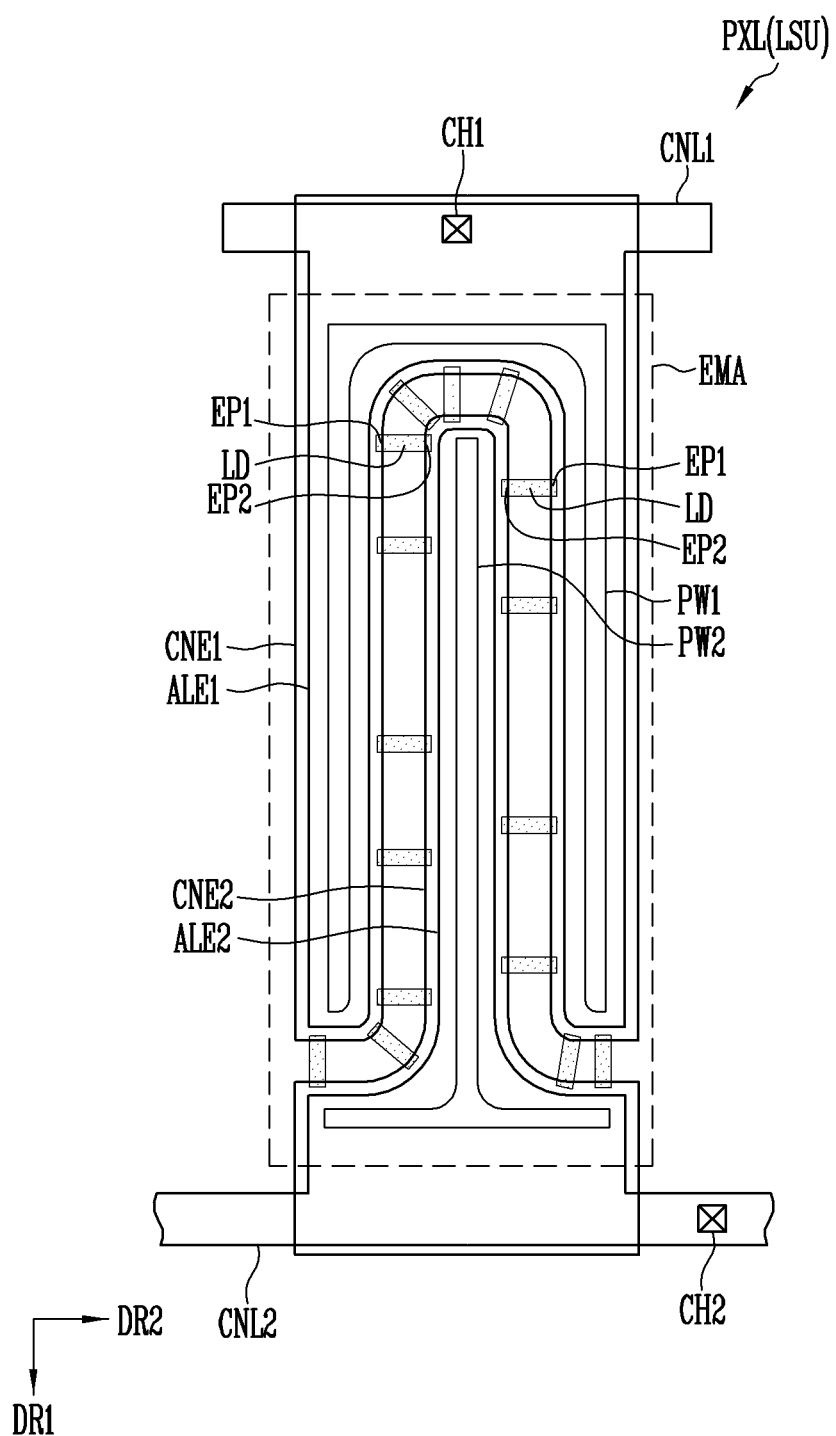
FIG. 13 is a plan view schematically illustrating a light emitting device in accordance with an embodiment of the disclosure, for example, illustrating an example of a pixel constituting the light emitting device.
Figure 14B:
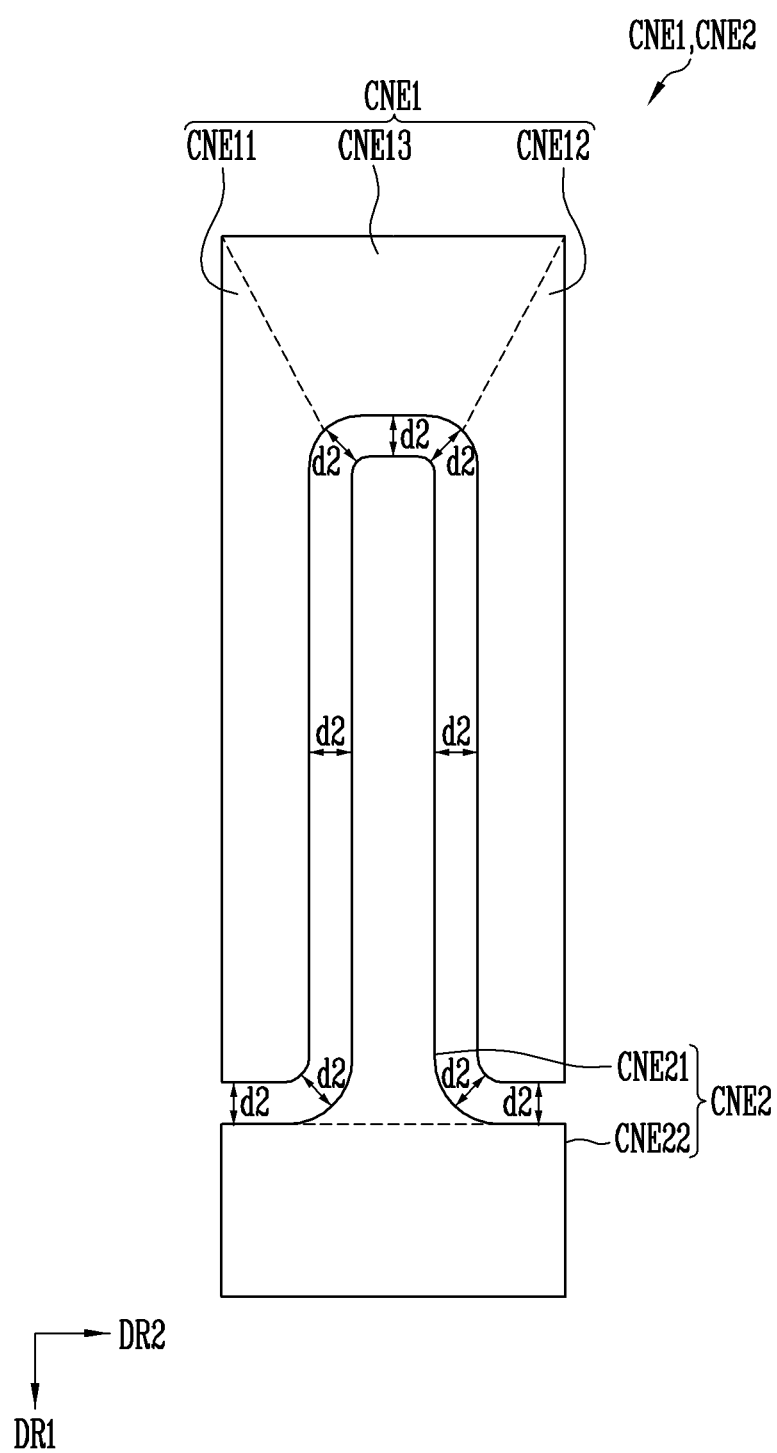
FIG. 14B is a plan view schematically illustrating first and second contact electrodes of FIG. 13.

FIG. 13 is a schematic plan view illustrating a light emitting device in accordance with an embodiment, for example, illustrating an example of a pixel PXL forming the light emitting device. FIG. 14A is a schematic plan view illustrating first and second alignment electrodes ALE1 and ALE2 of FIG. 13, and FIG. 14B is a schematic plan view illustrating first and second contact electrodes CNE1 and CNE2 of FIG. 13. In an embodiment, FIGS. 13 to 14B illustrate the modification of the pixel PXL according to the embodiment of FIGS. 11 to 12B.

Referring to FIGS. 13 to 14B, the third electrode part ALE13 of the first alignment electrode ALE1 may be directly connected to the first connection electrode CNL1 without having an opening OPN (see FIG. 11) between the third electrode part ALE13 and the first connection electrode CNL1. In this case, the third electrode part ALE13 of the first alignment electrode ALE1 may have a greater width.

The sub-electrode part ALE22 of the second alignment electrode ALE2 may be directly connected to the second connection electrode CNL2 without being spaced apart from the second connection electrode CNL2. In this case, the sub-electrode part ALE22 of the second alignment electrode ALE2 may have a greater width.

The first contact electrode CNE1 may have a shape corresponding to that of the first alignment electrode ALE1.

For instance, the third electrode part CNE13 of the first contact electrode CNE1 may have a greater width to overlap the third electrode part ALE13 of the first alignment electrode ALE1 and the first connection electrode CNL1.

The second contact electrode CNE2 may have a shape corresponding to that of the second alignment electrode ALE2. For instance, the sub-electrode part CNE22 of the second contact electrode CNE2 may have a greater width to overlap the sub-electrode part ALE22 of the second alignment electrode ALE2 and the second connection electrode CNL2.

Figure 15:
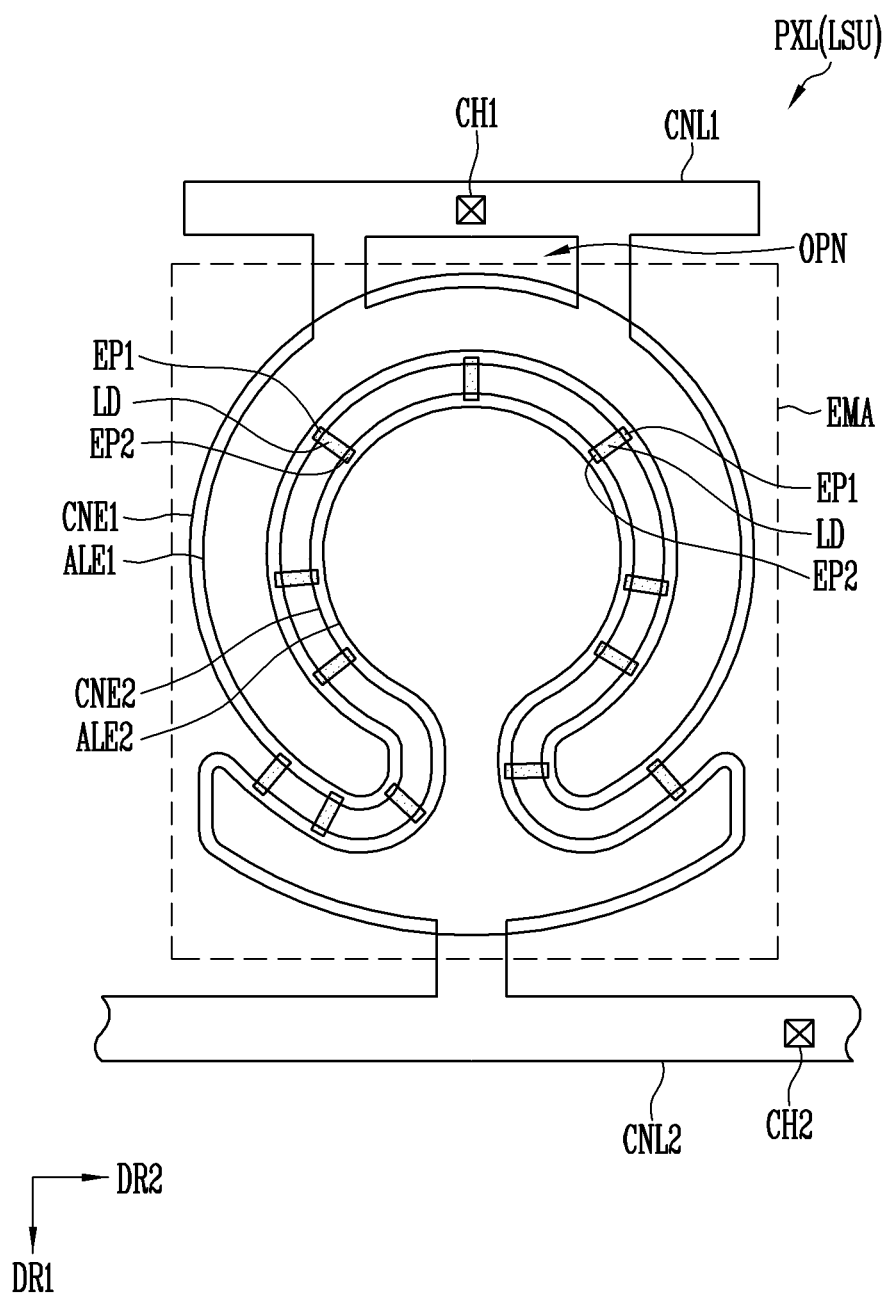
FIG. 15 is a plan view schematically illustrating a light emitting device in accordance with an embodiment of the disclosure, for example, illustrating an example of a pixel constituting the light emitting device.
Figure 16A:
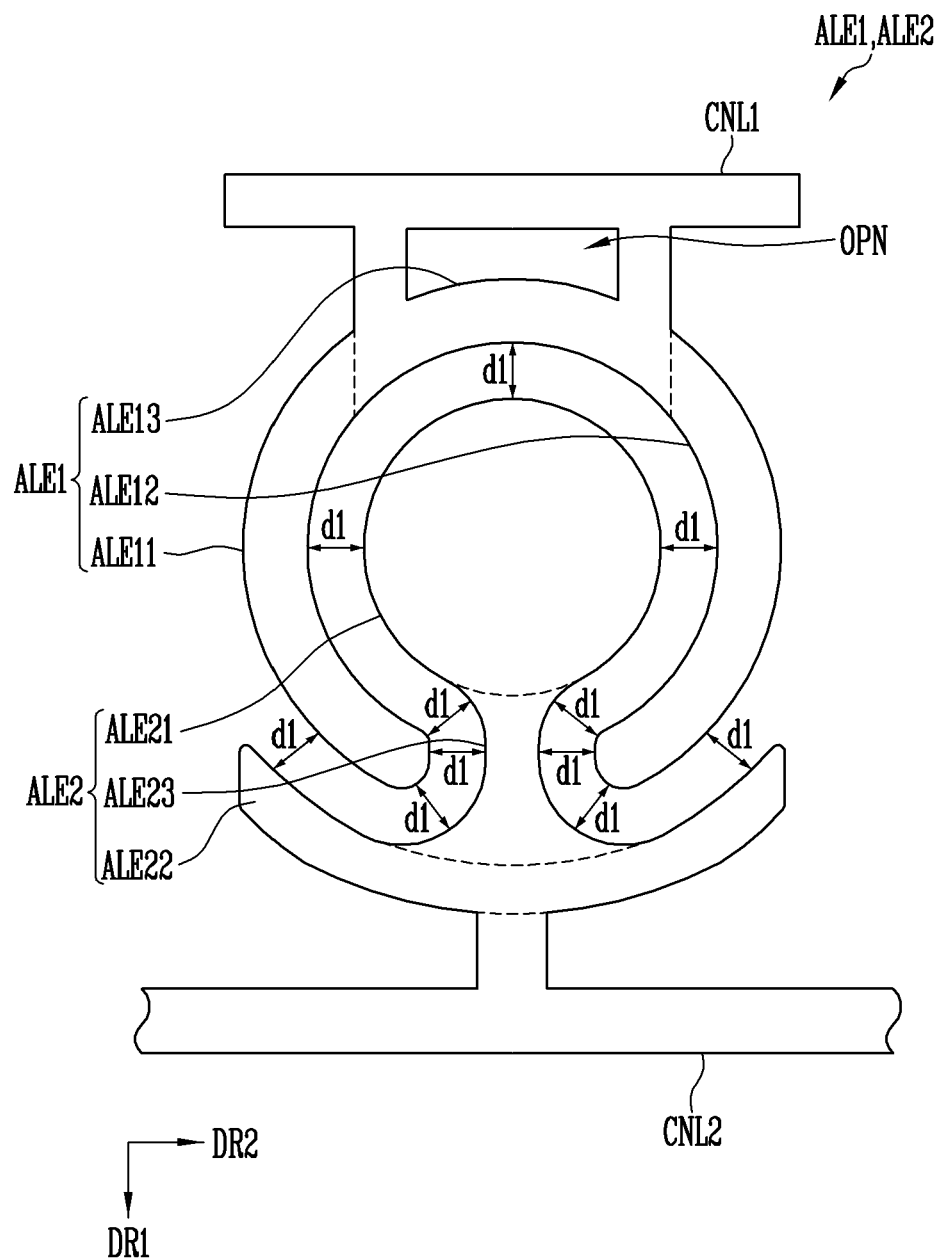
FIG. 16A is a plan view schematically illustrating first and second alignment electrodes of FIG. 15.
Figure 16B:
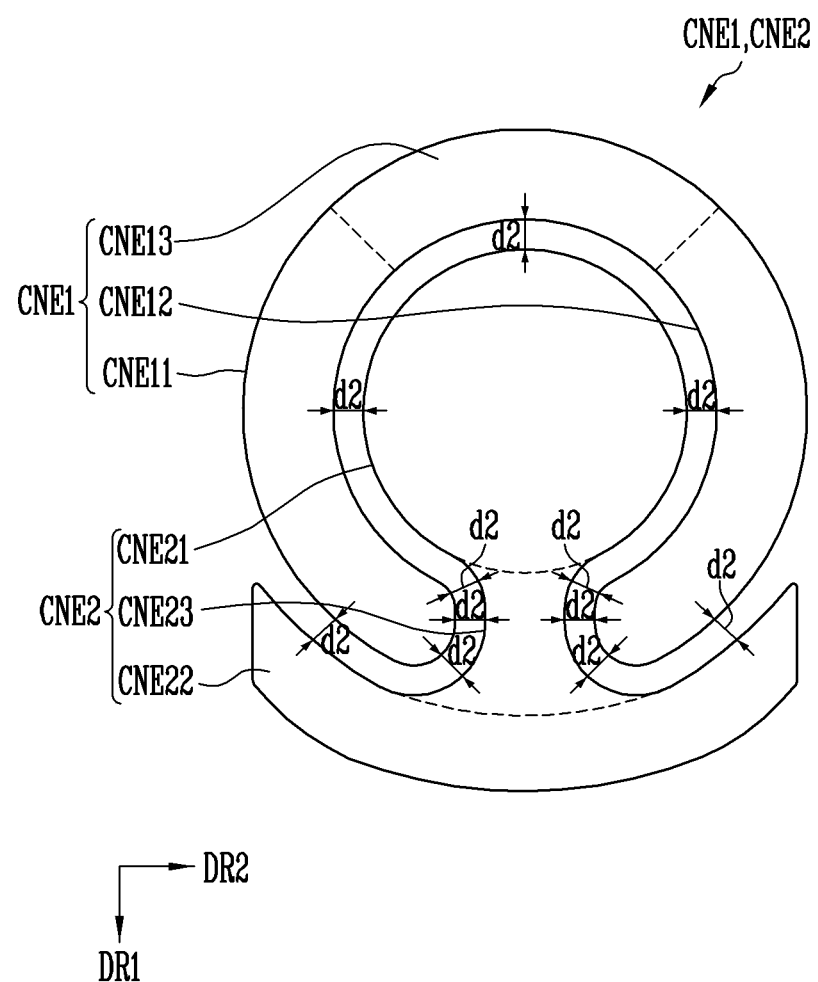
FIG. 16B is a plan view schematically illustrating first and second contact electrodes of FIG. 15.

FIG. 15 is a schematic plan view illustrating a light emitting device in accordance with an embodiment, for example, illustrating an example of a pixel PXL forming the light emitting device. FIG. 16A is a schematic plan view illustrating first and second alignment electrodes ALE1 and ALE2 of FIG. 15, and FIG. 16B is a schematic plan view illustrating first and second contact electrodes CNE1 and CNE2 of FIG. 15. In an embodiment, FIGS. 15 to 16B illustrate the modification of the pixel PXL according to the above-described embodiments, e.g., the embodiment(s) of FIGS. 11 to 12B. Although not illustrated in FIGS. 15 to 16B, the pixel PXL according to this embodiment may selectively further include first and/or second partition walls, at least one side of which faces the first and second ends EP1 and EP2 of the light emitting elements LD.

Referring to FIGS. 15 to 16B, the second alignment electrode ALE2 may include a circular main electrode part ALE21, and the first alignment electrode ALE1 may have a shape corresponding to that of the second alignment electrode ALE2. For instance, the first, second, and third electrode parts ALE11, ALE12, and ALE13 of the first alignment electrode ALE1 may enclose the main electrode part ALE21 while each having the shape of an open circle corresponding to the main electrode part ALE21 of the second alignment electrode ALE2. The first, second, and third electrode parts ALE11, ALE12, and ALE13 of the first alignment electrode ALE1 may be uniformly spaced apart from the second alignment electrode ALE2 by the first distance d1.

In an embodiment, the sub-electrode part ALE22 of the second alignment electrode ALE2 may have a shape corresponding to that of the first alignment electrode ALE1. For example, the sub-electrode part ALE22 of the second alignment electrode ALE2 may face the first end of each of the first and second electrode parts ALE11 and ALE12 of the first alignment electrode ALE1 and may be bent in the shape corresponding to those of both peripheral areas of the first alignment electrode ALE1 including the first end of each of the first and second electrode parts ALE11 and ALE12. The sub-electrode part ALE22 of the second alignment electrode ALE2 may be uniformly spaced apart from the first alignment electrode ALE1 by the first distance d1.

The second alignment electrode ALE2 may further include a connection electrode part ALE23 disposed between the main electrode part ALE21 and the sub-electrode part ALE22. The connection electrode part ALE23 may be integral with or non-integrally connected to the main electrode part ALE21 and the sub-electrode part ALE22 to connect the main electrode part ALE21 and the sub-electrode part ALE22.

The first and second contact electrodes CNE1 and CNE2 may have shapes corresponding to those of the first and second alignment electrodes ALE1 and ALE2, respectively. For example, the second contact electrode CNE2 may include a circular main electrode part CNE21 overlapping the main electrode part ALE21 of the second alignment electrode ALE2. The first contact electrode CNE1 may have a shape corresponding to that of the second contact electrode CNE2. For instance, the first, second, and third electrode parts CNE11, CNE12, and CNE13 of the first contact electrode CNE1 may enclose the main electrode part CNE21 while each having the shape of an open circle corresponding to the main electrode part CNE21 of the second contact electrode CNE2. The first, second, and third electrode parts CNE11, CNE12, and CNE13 of the first contact electrode CNE1 may be uniformly spaced apart from the second contact electrode CNE2 by the second distance d2.

In an embodiment, the sub-electrode part CNE22 of the second contact electrode CNE2 may have a shape corresponding to that of the first contact electrode CNE1. For example, the sub-electrode part CNE22 of the second contact electrode CNE2 may face the first end of each of the first and second electrode parts CNE11 and CNE12 of the first contact electrode CNE1 and may be bent in the shape corresponding to those of both peripheral areas of the first contact electrode CNE1 including the first end of each of the first and second electrode parts CNE11 and CNE12. Furthermore, the sub-electrode part CNE22 of the second contact electrode CNE2 may be uniformly spaced apart from the first contact electrode CNE1 by the second distance d2.

The second contact electrode CNE2 may further include a connection electrode part CNE23 disposed between the main electrode part CNE21 and the sub-electrode part CNE22. The connection electrode part CNE23 may be integral with or non-integrally connected to the main electrode part CNE21 and the sub-electrode part CNE22 to connect the main electrode part CNE21 and the sub-electrode part CNE22.

Figure 17:
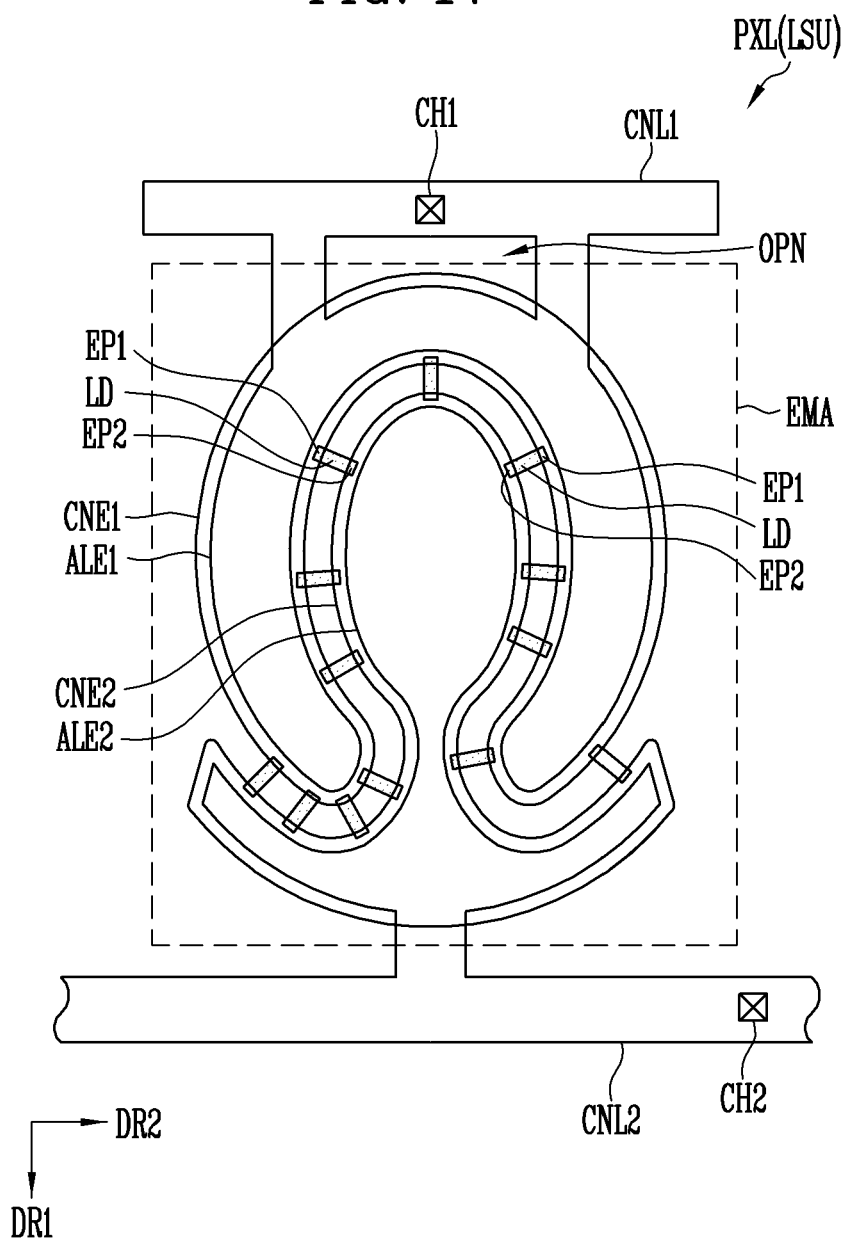
FIGS. 17 and 18 each are a plan view schematically illustrating a light emitting device in accordance with an embodiment of the disclosure, for example, illustrating different examples of a pixel constituting the light emitting device.
Figure 18:
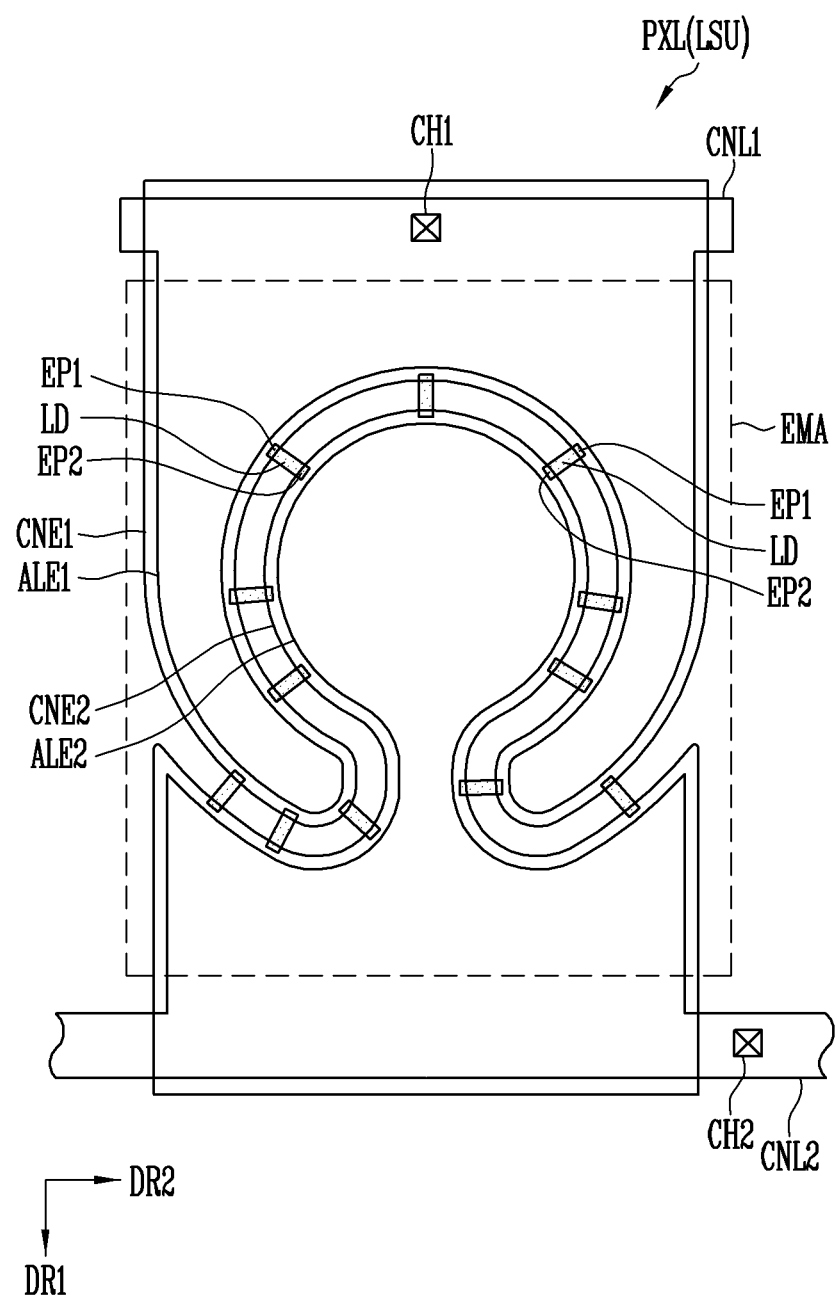

FIGS. 17 and 18 each are a schematic plan view illustrating a light emitting device in accordance with an embodiment, for example, illustrating different examples of a pixel PXL forming the light emitting device. In an embodiment, FIGS. 17 and 18 illustrate the modifications of the pixel PXL according to the above-described embodiments, e.g., the embodiment(s) of FIGS. 15 to 16B.

First, referring to FIG. 17, the second alignment electrode ALE2 may have an elliptical shape in an area surrounded by the first alignment electrode ALE1. For example, the main electrode part ALE21 of the circular second alignment electrode ALE2 as illustrated in FIG. 16A may be formed as an elliptical electrode part as illustrated in FIG. 17.

The first alignment electrode ALE1 may have a shape corresponding to that of the second alignment electrode ALE2, and thus a distance between the first alignment electrode ALE1 and the second alignment electrode ALE2 may be kept uniform in an area facing the second alignment electrode ALE2. For instance, the first alignment electrode ALE1 may be spaced apart from the second alignment electrode ALE2 by a uniform distance while at least one area is formed to have the shape of an elliptical open circle.

Similarly, the second contact electrode CNE2 may have an elliptical shape in an area surrounded by the first contact electrode CNE1. For example, the main electrode part CNE21 of the circular second contact electrode CNE2 as illustrated in FIG. 16B may be formed as an elliptical electrode part as illustrated in FIG. 17.

The first contact electrode CNE1 may maintain a uniform distance from the second contact electrode CNE2 in an area of the second contact electrode CNE2. For instance, the first contact electrode CNE1 may be spaced apart from the second contact electrode CNE2 by a uniform distance while having the shape of an elliptical open circle.

Referring to FIG. 18, the first alignment electrode ALE1 may be directly connected to the first connection electrode CNL1 without including the opening OPN (see FIG. 15) between the first alignment electrode ALE1 and the first connection electrode CNL1. The first contact electrode CNE1 may have a greater width in the first direction DR1 in a first peripheral area (e.g., an upper-end area) of the emission area EMA to overlap the first alignment electrode ALE1 and the first connection electrode CNL1.

The second alignment electrode ALE2 may be directly connected to the second connection electrode CNL2 without being spaced apart from the second connection electrode CNL2. The second contact electrode CNE2 may have a greater width in the first direction DR1 in a second peripheral area (e.g., a lower-end area) of the emission area EMA to overlap the second alignment electrode ALE2 and the second connection electrode CNL2.

The pixel PXL and the display device including the pixel PXL according to various embodiments of the disclosure described with reference to FIGS. 6A to 18 may form the light source unit LSU of each pixel PXL by more efficiently using the light emitting elements LD supplied in each emission area EMA. The shapes of the first and second alignment electrodes ALE1 and ALE2 and/or the first and second contact electrodes CNE1 and CNE2 may be changed in various ways.

While the scope of the disclosure is described by detailed embodiments, it should be noted that the above-described embodiments are merely descriptive and should not be considered limiting. It should be understood by those skilled in the art that various changes, substitutions, and alternations may be made herein without departing from the scope of the disclosure as defined by the claims.

The scope of the claimed invention is not limited by detailed descriptions of the specification and should be defined by the accompanying claims. Furthermore, all changes or modifications of the disclosure derived from the meanings and scope of the claims, and equivalents thereof should be construed as being included in the scope of the disclosure.

What is claimed is:

1. A display device, comprising:
   a plurality of pixels, each of the plurality of pixels including:
      an emission area;
      a first electrode and a second electrode that are disposed in the emission area to be spaced apart from each other; and
      a plurality of light emitting elements that are electrically connected between the first and second electrodes; and
   a bank disposed between the emission area of each of the plurality og pixels to enclose the emission area,
   wherein the first electrode comprises:
      a first electrode part disposed in the emission area to be adjacent to a first side of the second electrode;
      a second electrode part disposed in the emission area to be adjacent to a second side of the second electrode; and
      a third electrode part electrically connecting the first and second electrode parts and disposed in the emission area to be adjacent to a third side of the second electrode.

2. The display device according to claim 1, wherein each of the first, second, and third electrode parts is spaced apart from the second electrode by a distance that is equal to or less than a length of each of the plurality of light emitting elements.

3. The display device according to claim 1, wherein at least two of the first, second, and third electrode parts are spaced apart from the second electrode by a same distance.

4. The display device according to claim 1, wherein
   the first and second electrode parts extend in a first direction in the emission area to be parallel to each other, and
   the third electrode part extends in a second direction intersecting the first direction in the emission area.

5. The display device according to claim 1, wherein the first, second, and third electrode parts are integral with each other.

6. The display device according to claim 1, wherein
   the first electrode is bent so that a part of the first electrode facing the second electrode at a boundary between the first, second, and third electrode parts is curved, and
   a part of the second electrode facing the part of the first electrode is curved and corresponds to a shape of the first electrode.

7. The display device according to claim 1, wherein
   the first and second electrode parts are symmetrical with each other, and
   the second electrode is disposed between the first and second electrode parts.

8. The display device according to claim 1, wherein the second electrode comprises:
   a main electrode part disposed between the first and second electrode parts, and enclosed by the first electrode; and
   a sub-electrode part electrically connected to a first end of the main electrode part and extending in a direction different from a direction in which the main electrode part extends, to face a first end of each of the first and second electrode parts.

9. The display device according to claim 8, wherein
   the first and second electrode parts and the main electrode part extend in a first direction in the emission area to be parallel to each other, and
   the third electrode part and the sub-electrode part extend in a second direction intersecting the first direction in the emission area to be parallel to each other.

10. The display device according to claim 1, wherein
   the second electrode comprises a main electrode part that is circular or elliptical, and
   the first, second, and third electrode parts enclose the main electrode part and have a shape corresponding to a shape of the main electrode part.

11. The display device according to claim 10, wherein the second electrode comprises a sub-electrode part that is electrically connected to the main electrode part and is disposed in the emission area to face a first end of each of the first and second electrode parts.

12. The display device according to claim 1, wherein each of the plurality of light emitting elements comprises:
   a first end overlapping the first electrode and electrically connected to the first electrode; and
   a second end overlapping the second electrode and electrically connected to the second electrode.

13. The display device according to claim 12, wherein each of the plurality of pixels comprises:
   a third electrode overlapping the first electrode, having a shape corresponding to a shape of the first electrode, and electrically connected to the first end of each of the plurality of light emitting elements through the first electrode; and a fourth electrode overlapping the second electrode, having a shape corresponding to a shape of the second electrode, and electrically connected to the second end of each of the plurality of light emitting elements through the second electrode.

14. The display device according to claim 13, wherein
the third electrode is electrically connected to a first line to which first power or a first driving signal is supplied, and
the fourth electrode is electrically connected to a second line to which second power or a second driving signal is supplied.

15. The display device according to claim 13, wherein each of the plurality of pixels comprises:
a first wall disposed under the third electrode, having a width that is narrower than a width of the third electrode, and having a shape corresponding to the shape of the third electrode; and
a second wall disposed under the fourth electrode, having a width that is narrower than a width of the fourth electrode, and having a shape corresponding to the shape of the fourth electrode.

16. A display device, comprising:
a plurality of pixels, each of the plurality pixels including:
an emission area;
a first electrode and second electrode that are disposed in the emission area to be spaced apart from each other; and
a plurality of light emitting elements that are electrically connected between the first and second electrodes; and
a bank disposed between the emission area of each of the plurality of pixels to enclose the emission area,
wherein the second electrode comprises:
a main electrode part disposed in the emission area to be enclosed by the first electrode; and
a sub-electrode part electrically connected to a first end of the main electrode part and extending in a direction different from a direction in which the main electrode part extends, in the emission area to face ends of the first electrode.

17. The display device according to claim 16, wherein the first electrode comprises:
a first electrode part disposed in the emission area to be adjacent to a first side of the main electrode part;
a second electrode part disposed in the emission area to be adjacent to a second side of the main electrode part; and
a third electrode part electrically connecting the first and second electrode parts, and disposed in the emission area to be adjacent to a third side of the main electrode part.

18. The display device according to claim 17, wherein each of the first, second, and third electrode parts is spaced apart from the second electrode by a distance that is equal to or less than a length of each of the plurality of light emitting elements.

19. The display device according to claim 17, wherein at least two of the first, second, and third electrode parts are spaced apart from the second electrode by a same distance.

20. The display device according to claim 16, wherein each of the plurality of pixels comprises:
a third electrode overlapping the first electrode, having a shape corresponding to a shape of the first electrode, and electrically connected to a first end of each of the plurality of light emitting elements through the first electrode; and
a fourth electrode overlapping the second electrode, having a shape corresponding to a shape of the second electrode, and electrically connected to a second end of each of the plurality of light emitting elements through the second electrode.

* * * * *